(12) United States Patent
Nosaka

(10) Patent No.: US 10,382,009 B2
(45) Date of Patent: Aug. 13, 2019

(54) RADIO FREQUENCY FRONT-END CIRCUIT AND COMMUNICATION DEVICE

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/056,935

(22) Filed: Aug. 7, 2018

(65) Prior Publication Data

US 2018/0343000 A1 Nov. 29, 2018

Related U.S. Application Data

(63) Continuation of application No. PCT/JP2017/004461, filed on Feb. 7, 2017.

(30) Foreign Application Priority Data

Feb. 8, 2016 (JP) ................. 2016-022272

(51) Int. Cl.
*H03H 7/38* (2006.01)
*H03H 9/64* (2006.01)
(Continued)

(52) U.S. Cl.
CPC ............... *H03H 9/72* (2013.01); *H03H 7/38* (2013.01); *H03H 9/14544* (2013.01);
(Continued)

(58) Field of Classification Search
CPC combination set(s) only.
See application file for complete search history.

(56) References Cited

U.S. PATENT DOCUMENTS 6,472,953 B1 10/2002 Sakuragawa et al.
6,483,399 B1 11/2002 Atokawa
(Continued)

FOREIGN PATENT DOCUMENTS

JP 2000-323961 A 11/2000
JP 2001-160766 A 6/2001
(Continued)

OTHER PUBLICATIONS

International Search Report for International Application No. PCT/JP2017/004461, dated Apr. 25, 2017.
(Continued)

*Primary Examiner* — Ganiyu A Hanidu
(74) *Attorney, Agent, or Firm* — Pearne & Gordon LLP

(57) ABSTRACT

An RF front-end circuit (2) includes an antenna common terminal (20) connected to an antenna element (1), an SPDT switch circuit (21) having a common terminal (21c) and select terminals (21s1 and 21s2), and four filter elements (22A to 22D). The common terminal (21c) and the filter elements (22C and 22D) are connected to the antenna common terminal (20). The filter elements (22A and 22B) are connected to the select terminals (21s1 and 21s2), respectively. Pass bands of the filter elements (22A, 22C and 22D) do not overlap with one another, and pass bands of the filter elements (22B, 22C and 22D) do not overlap with one another. The pass bands of the filter elements (22A and 22B) partly overlap with each other.

16 Claims, 13 Drawing Sheets

(51) Int. Cl.
*H03H 9/72* (2006.01)
*H04B 1/44* (2006.01)
*H04B 1/48* (2006.01)
*H04B 1/50* (2006.01)
*H04B 1/00* (2006.01)
*H03H 9/145* (2006.01)

(52) U.S. Cl.
CPC ............... *H03H 9/64* (2013.01); *H04B 1/00* (2013.01); *H04B 1/006* (2013.01); *H04B 1/0057* (2013.01); *H04B 1/44* (2013.01); *H04B 1/48* (2013.01); *H04B 1/50* (2013.01); *H03H 9/6403* (2013.01); *H03H 9/6483* (2013.01)

(56) References Cited

U.S. PATENT DOCUMENTS

| | | | | |
|---|---|---|---|---|
| 2005/0079828 | A1* | 4/2005 | Tasaka | H04B 1/006 455/78 |
| 2011/0234335 | A1* | 9/2011 | Khlat | H04B 1/406 333/132 |
| 2011/0260806 | A1* | 10/2011 | Takeuchi | H03H 7/38 333/103 |
| 2013/0162495 | A1* | 6/2013 | Kwon | H01Q 21/28 343/852 |
| 2014/0225680 | A1 | 8/2014 | Fujiwara et al. | |
| 2016/0301383 | A1 | 10/2016 | Tani | |
| 2018/0198438 | A1 | 7/2018 | Park | |
| 2018/0226928 | A1* | 8/2018 | Obiya | H04B 1/00 |
| 2018/0227008 | A1* | 8/2018 | Obiya | H03F 3/195 |

FOREIGN PATENT DOCUMENTS

| | | |
|---|---|---|
| JP | 2009-130831 A | 6/2009 |
| JP | 2014-50098 A | 3/2014 |
| WO | 2013/080428 A1 | 6/2013 |
| WO | 2015/099105 A1 | 7/2015 |

OTHER PUBLICATIONS

Written Opinion for International Application No. PCT/JP2017/004461, dated Apr. 25, 2017.

* cited by examiner

RESONANT FREQUENCY OF PARALLEL ARM RESONATOR 225p2
< RESONANT FREQUENCY OF PARALLEL ARM RESONATOR 226p2
< RESONANT FREQUENCY OF PARALLEL ARM RESONATOR 227p2

RADIO FREQUENCY FRONT-END CIRCUIT AND COMMUNICATION DEVICE

This is a continuation of International Application No. PCT/JP2017/004461 filed on Feb. 7, 2017 which claims priority from Japanese Patent Application No. 2016-022272 filed on Feb. 8, 2016. The contents of these applications are incorporated herein by reference in their entireties.

BACKGROUND

Technical Field

The present disclosure relates to a radio frequency front-end circuit allowing radio frequency signals in three or more frequency bands to pass therethrough, and to a communication device.

Hitherto, a radio frequency front-end circuit allowing radio frequency signals in a plurality of frequency bands to pass selectively therethrough has been put into practice to be adapted for further sophistication of mobile communication devices, such as multimode/multiband models.

Patent Document 1 discloses a front-end module 601 allowing selective passage of received radio frequency signals in eight frequency bands, which are received via an antenna (ANT), and outputting the selected signal to an RF signal processing circuit in a subsequent stage. FIG. 15 is a circuit block diagram of the front-end module 601 disclosed in Patent Document 1. The front-end module 601 includes a switch 610 of SP8T (Single Pole 8 Throw) type, eight SAW filters 621 to 628, and a switch 630 of DP16T (Dual Pole 16 Throw) type. The eight SAW filters 621 to 628 are unbalanced input—balanced output filter elements allowing received radio frequency signals in Band7, Band2, Band3, Band1(4), Band5, Band8, Band12(17), and Band 20 to pass therethrough, respectively. With such a configuration, the front-end module 601 is able to integrate output signals of the plural SAW filters and to output an integrated signal to the RF signal processing circuit in the subsequent stage while a demanded attenuation value and a demanded isolation value in the adjacent frequency bands are satisfied.

Patent Document 1: Japanese Unexamined Patent Application Publication No. 2014-50098

BRIEF SUMMARY

In the above-described front-end module of the related art, however, a switch including select terminals in the same number as that of bands (frequency bands) is required between an antenna element and the plural filter elements. In particular, in the case of processing three or more frequency bands, a switch of SPnT (n≥3: Single Pole n Throw) type including three or more select terminals is required between the antenna element and the plural filter elements. Thus, the circuit size and cost are increased.

With intent to solve the above-described problem the present disclosure provides a radio frequency front-end circuit and a communication device, the radio frequency front-end circuit including signal paths through which radio frequency signals in three or more frequency bands pass selectively, and being able to realize reduction in the circuit size and cost while satisfactory attenuation characteristics and isolation characteristics are ensured.

A radio frequency front-end circuit according to one aspect of the present disclosure includes an antenna common terminal connected to an antenna element, a first switch circuit of Single Pole Double Throw type having one common terminal and two select terminals, and three or more filter elements allowing radio frequency signals in different frequency bands to pass therethrough, wherein the common terminal of the first switch circuit and one or more among the three or more filter elements are connected to the antenna common terminal, wherein a first filter element and a second filter element among the three or more filter elements except for the one or more filter elements are connected to the two select terminals in a one-to-one relation, wherein the one or more filter elements and the first filter element do not overlap in pass band with each other, wherein the one or more filter elements and the second filter element do not overlap in pass band with each other, and wherein a first pass band given by a pass band of the first filter element and a second pass band given by a pass band of the second filter element at least partly overlap with each other, or a frequency interval between the first pass band and the second pass band is not more than 3% of a center frequency between the first pass band and the second pass band.

Up to now, when trying to, in a radio frequency front-end circuit allowing selective propagation of radio frequency signals in three or more frequency bands, bundle three or more signal paths corresponding to the frequency bands together at an antenna common terminal, a switch circuit of SPnT (n≥3) type having three or more select terminals, or a demultiplexer for demultiplexing a radio frequency signal into three or more frequency bands is connected to the antenna common terminal.

In contrast, with the features described above, the one or more filter elements having the pass bands apart away from one another among the three or more filter elements are directly connected to the antenna common terminal, and the first switch circuit of SPDT (Single Pole Double Throw) type is disposed between the antenna common terminal and both the first and second filter elements that have the pass bands overlapping with or close to each other. Therefore, the number of select terminals of a switch element can be reduced and the reduction in the circuit size and cost can be realized, while isolation between adjacent signal paths is ensured.

At least one among the three or more filter elements may be a frequency variable filter of which pass band is changed.

With the feature described above, a pass band can be adjusted depending on a channel to be used among a plurality of channels allocated to one frequency band. Furthermore, since the pass band of each channel is switched over without necessarily disposing any switch element in a stage before or after the frequency variable filter. Hence the reduction in the circuit size and cost can be realized.

The frequency variable filter may include a first input/output terminal and a second input/output terminal; a serial arm resonator connected between the first input/output terminal and the second input/output terminal; a first parallel arm resonator connected between a ground terminal and a node on a path interconnecting the first input/output terminal, the serial arm resonator, and the second input/output terminal; a second parallel arm resonator connected between the node and the ground terminal; and a switch element disposed between the node and the ground terminal, and switching over electrical continuity and discontinuity of a path interconnecting the node, the second parallel arm resonator, and the ground terminal, wherein a resonant frequency of the first parallel arm resonator may be lower than a resonant frequency of the serial arm resonator, and a resonant frequency of the second parallel arm resonator may be higher than the resonant frequency of the first parallel arm resonator.

With the features described above, in the bandpass frequency variable filter constituted by the serial arm resonator and the parallel arm resonators, when the switch element is in a non-conducted state, first bandpass characteristics are formed by the serial arm resonator and the first parallel arm resonator. When the switch element is in a conducted state, second bandpass characteristics different from the first bandpass characteristics are formed by the serial arm resonator and a combined resonator of the first and second parallel arm resonators. Here, in combined characteristics of the first and second parallel arm resonators, a resonance point of the second parallel arm resonator is present on the higher frequency side than that of the first parallel arm resonator and on the lower frequency side than an anti-resonant frequency of the serial arm resonator. Furthermore, in the combined characteristics of the first and second parallel arm resonators, a first anti-resonance point reflecting the first parallel arm resonator is present on the lower frequency side than an anti-resonant frequency of the first parallel arm resonator, and hence the second bandpass characteristics have a narrower band width than the first bandpass characteristics. Thus, the pass band of the frequency variable filter can be adjusted with a switching operation of the switch element. In the past, two filter circuits and an SPDT switch circuit for switching over those two filters have been required as a filter circuit applied to a system in which two channels are to be exclusively selected. In contrast, one filter circuit and a switch element of SPST (Single Pole Single Throw) type are just required in the frequency variable filter having the above-described features. As a result, the frequency variable filter can be simplified and downsized, and reduction in the size and cost of the radio frequency front-end circuit can be realized.

The resonant frequency of the second parallel arm resonator may be higher than the resonant frequency of the serial arm resonator and lower than the anti-resonant frequency of the serial arm resonator.

With the feature described above, the resonant frequency of the second parallel arm resonator is higher than the resonant frequency of the serial arm resonator, which affects the insertion loss near a center frequency within the pass band, and is lower than the anti-resonant frequency of the serial arm resonator, which corresponds to an attenuation pole on the higher frequency side outside the pass band. Consequently, when the switch element is conducted, the attenuation pole on the higher frequency side outside the pass band can be shifted toward the lower frequency side while a low loss within the pass band is maintained. Thus, since a higher frequency end of the pass band can be shifted toward the lower frequency side when the switch element is conducted, a pass band width can be narrowed without necessarily reducing steepness of the bandpass characteristics.

A plurality of resonance circuits each constituted by the second parallel arm resonator and the switch element connected in series may be connected in parallel between the node and the ground terminal, and resonant frequencies of the second parallel arm resonators in the plurality of resonance circuits may be different from one another.

With the features described above, in the first bandpass characteristics specified by the serial arm resonator and the first parallel arm resonator, the band width can be finely adjusted by optionally selecting the switch element in the resonance circuit, which is to be conducted, from among the plurality of resonance circuits each constituted by the second parallel arm resonator and the switch element.

The frequency variable filter may include plural stages of filter structures, each stage being constituted by a number one of the serial arm resonator and a number one of the parallel arm resonator, and each of two or more filter structures among the plural stages of the filter structures may include the second parallel arm resonator and the switch element.

With the features described above, in bandpass characteristics specified by the plural stages of ladder filter structures, the band width can be finely adjusted by optionally selecting the switch element to be conducted and the number of the selected switch element(s).

The radio frequency front-end circuit may further include a first inductor connected in series between the second parallel arm resonator and the switch element.

With the first inductor connected in series between the second parallel arm resonator and the switch element, a resonant frequency of the resonance circuit including the second parallel arm resonator is reduced. In expectation of such a frequency reduction, therefore, the resonant frequency of the second parallel arm resonator can be designed to have a higher value. Thus, the size of the second parallel arm resonator can be reduced, and space saving can be realized.

The radio frequency front-end circuit may further include a first impedance matching circuit connected to a connection node between one of the select terminals of the first switch circuit and the first filter element, and a second impedance matching circuit connected to a connection node between the other select terminal of the first switch circuit and the second filter element, and a complex impedance of the first impedance matching circuit and a complex impedance of the second impedance matching circuit may be different from each other.

With the features described above, the impedance matching circuit is connected to the connection node between the select terminal and the filter element instead of being connected to a connection node between the antenna common terminal and the common terminal. Accordingly, a first complex impedance looking at the filter side from the antenna common terminal when the first filter element and the above-mentioned one or more filter elements are connected to the antenna common terminal can be made different from a second complex impedance looking at the filter side from the antenna common terminal when the second filter element and the above-mentioned one or more filter elements are connected to the antenna common terminal. Thus, impedance matching can be established separately for each of the first filter element and the second filter element depending on switching of the first switch circuit.

The first impedance matching circuit may include a second inductor connected to a connection node between the one of the select terminals of the first switch circuit and the first filter element and to the ground terminal, the second impedance matching circuit may include a third inductor connected to a connection node between the other select terminal of the first switch circuit and the second filter element and to the ground terminal, and an inductance value of the second inductor and an inductance value of the third inductor may be different from each other.

With the features described above, the first complex impedance and the second complex impedance can be made different from each other. Thus, impedance matching can be established separately for each of the first filter element and the second filter element depending on switching of the first switch circuit.

The radio frequency front-end circuit may further include a second switch circuit having a common terminal and two or more select terminals, the two or more select terminals being connected in a one-to-one relation to terminals of at least two or more among the three or more filter elements on the side opposite to the antenna common terminal.

With the feature described above, since the radio frequency front-end circuit further includes the second switch circuit inserted in an anterior or posterior stage in which the plurality of filter elements are bundled together, attenuation characteristics and isolation characteristics in and between the adjacent frequency bands can be improved. In addition, terminals for connecting the plurality of filter elements to the RF signal processing circuit are integrated by the second switch circuit. Accordingly, the number of terminals of the RF signal processing circuit can be reduced, and the RF signal processing circuit can be simplified and reduced in cost.

The three or more filter elements may be each one of a surface acoustic wave filter, an acoustic wave filter using BAW, an LC resonance filter, and a dielectric filter.

With the feature described above, since the size of the filter element can be reduced, the reduction in the circuit size and cost can be realized.

The first switch circuit may be constituted by a FET switch made of GaAs or CMOS, or a diode switch.

With the feature described above, since the number of components constituting the first switch circuit of SPDT type can be significantly reduced in comparison with that needed in an SP3T switch, the reduction in the circuit size and cost can be realized.

The radio frequency front-end circuit may further include an amplifier that amplifies a transmitted radio frequency signal or a received radio frequency signal, and each of the three or more filter elements may allow or block passage of the transmitted radio frequency signal which has been amplified by the amplifier or the received radio frequency signal, depending on a frequency of the transmitted radio frequency signal or the received radio frequency signal.

With the features described above, reduction in the size and cost of the radio frequency front-end circuit disposed in a transmission system including a power amplifier can be realized.

A communication device according to another aspect of the present disclosure includes an RF signal processing circuit that processes a baseband signal or a radio frequency signal, and the above-described radio frequency front-end circuit.

With the feature described above, reduction in the size and cost of the communication device can be realized.

With the radio frequency front-end circuit according to the present disclosure, since the number of select terminals of the switch circuit connected to the antenna common terminal can be reduced in comparison with that needed in the related art, the reduction in the circuit size and cost can be realized, while satisfactory attenuation characteristics and isolation characteristics are ensured.

BRIEF DESCRIPTION OF THE SEVERAL VIEWS OF THE DRAWINGS

FIG. 11B is a graph representing impedance characteristics and bandpass characteristics of the frequency variable filter according to Embodiment 2 when the switch is turned on.

FIG. 11C is a graph comparatively representing the impedance characteristics and the bandpass characteristics of the frequency variable filter according to Embodiment 2 when the switch is turned off and when it is turned on.

DETAILED DESCRIPTION

Figure 1:
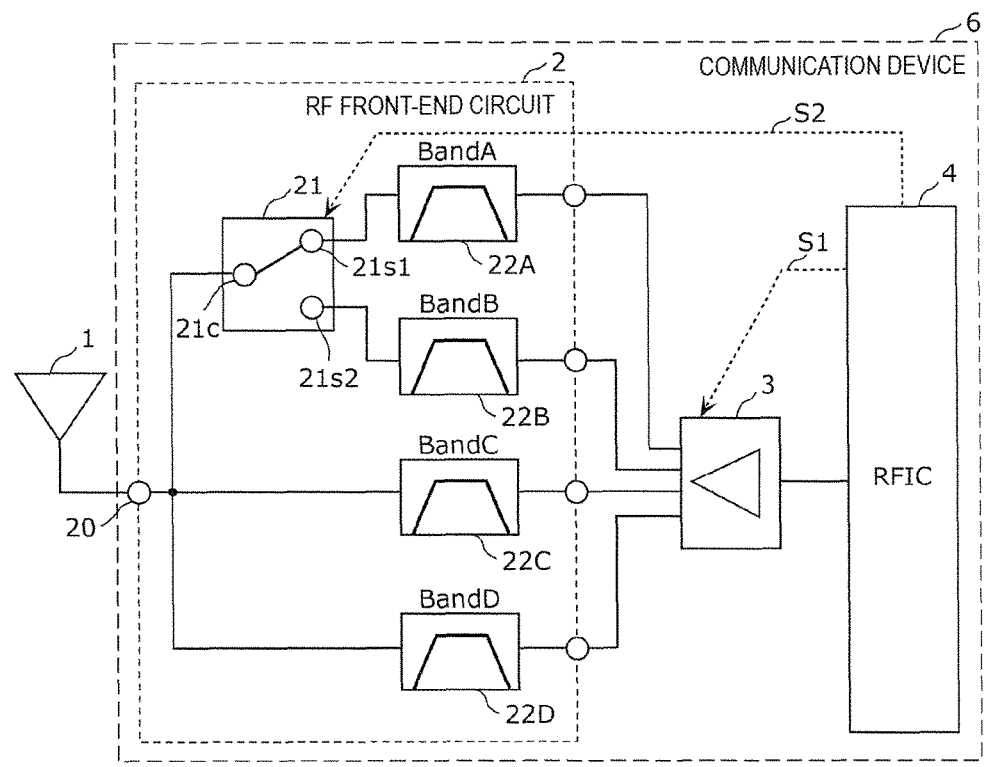
FIG. 1 is a circuit block diagram of a communication device according to Embodiment 1.

Embodiments of the present disclosure will be described in detail below with reference to examples and drawings. It is to be noted that any of the following embodiments represents a generic or specific example. Numerical values, shapes, materials, constituent elements, arrangements and connection forms of the constituent elements, etc., which are described in the following embodiments, are merely illustrative, and they are not purported to limit the scope of the present disclosure. Among the constituent elements in the following embodiments, those ones not stated in independent Claims are explained as optional constituent elements. Sizes or relative size ratios of the constituent elements illustrated in the drawings are not always exactly true in a strict sense. In the drawings, substantially the same constituent elements are denoted by the same reference sings, and duplicate description of those constituent elements is omitted or simplified in some cases.

Embodiment 1

[1.1 Configuration of RF Front-End Circuit]

FIG. 1 is a circuit block diagram of a communication device 6 according to Embodiment 1. An antenna element 1 and the communication device 6 are illustrated in FIG. 1. The communication device 6 includes an RF front-end circuit 2, a power amplifier circuit 3, and an RF signal processing circuit (RFIC) 4. The antenna element 1, the RF front-end circuit 2, the power amplifier circuit 3, and the RFIC 4 are disposed in a front-end section of a multimode/multiband compatible cellular phone, for example.

The RFIC 4 executes signal processing on a transmitted baseband signal, which is input, for example, from a baseband signal processing circuit (not illustrated), through up-conversion, etc., and outputs a transmitted radio frequency signal produced through the signal processing to the power amplifier circuit 3. Furthermore, the RFIC 4 functions as a control unit for controlling the power amplifier circuit 3 and connection states of switch circuits in the RF front-end circuit 2 depending on a frequency band to be used.

The power amplifier circuit 3 is a power amplifier for amplifying power of the transmitted radio frequency signal output from the RFIC 4, and it outputs the amplified transmitted radio frequency signal to one among a plurality of signal paths in the RF front-end circuit 2 in accordance with a control signal S1 from the RFIC 4.

The RF front-end circuit 2 is a radio frequency front-end circuit including an antenna common terminal 20, a switch circuit 21, and filter elements 22A, 22B, 22C and 22D. Thus, the RF front-end circuit 2 has four signal paths through which radio frequency signals in predetermined frequency bands pass selectively. In more detail, the transmitted radio frequency signal in a frequency band A (also denoted by "Band A") is output to the antenna element 1 through a signal path passing the RFIC 4, the power amplifier circuit 3, the filter element 22A, the switch circuit 21, and the antenna common terminal 20. The transmitted radio frequency signal in Band B is output to the antenna element 1 through a signal path passing the RFIC 4, the power amplifier circuit 3, the filter element 22B, the switch circuit 21, and the antenna common terminal 20. The transmitted radio frequency signal in Band C is output to the antenna element 1 through a signal path passing the RFIC 4, the power amplifier circuit 3, the filter element 22C, and the antenna common terminal 20. The transmitted radio frequency signal in Band D is output to the antenna element 1 through a signal path passing the RFIC 4, the power amplifier circuit 3, the filter element 22D, and the antenna common terminal 20.

As an alternative, the RF front-end circuit 2 may include the power amplifier circuit 3.

Figure 2:
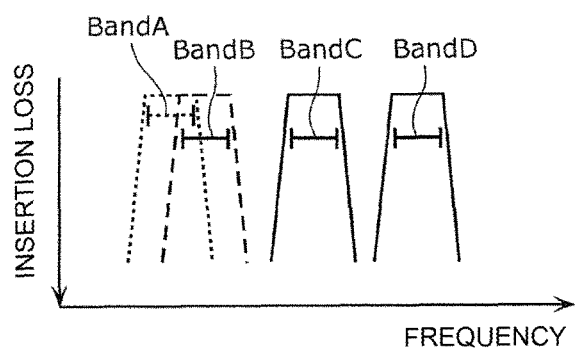
FIG. 2 is a chart referenced to explain relations between bandpass characteristics of four filter elements according to Embodiment 1 and allocated frequency bands.

FIG. 2 is a chart referenced to explain relations between bandpass characteristics of the four filter elements according to Embodiment 1 and allocated frequency bands. In a multimode/multiband compatible system in which three or more frequency bands are used, respective frequency bands of Band A/B, Band C, and Band D are discretely arranged. On the other hand, Band A and Band B partly overlap with each other in frequency band, and they are selectively used in an exclusive way. The filter elements 22A to 22D are disposed in the signal paths through which radio frequency signals in Bands A to D according to the above frequency allocation pass selectively. Band A is, for example, Band28A (transmission pass band: 703 to 733 MHz) in conformity with the LTE (Long Term Evolution) standards. Band B is, for example, Band28B (transmission pass band: 718 to 748 MHz) in conformity with the LTE standards. Band C is, for example, Band26 (transmission pass band: 814 to 849 MHz) in conformity with the LTE standards. Band D is, for example, Band8 (transmission pass band: 880 to 915 MHz) in conformity with the LTE standards.

The filter element 22A is a first filter element of bandpass type allowing selective passage of the frequency band of Band A. The filter element 22B is a second filter element of bandpass type allowing selective passage of the frequency band of Band B. The filter element 22C is a filter element of bandpass type allowing selective passage of the frequency band of Band C. The filter element 22D is a filter element of bandpass type allowing selective passage of the frequency band of Band D. To be adapted for the frequency band allocation illustrated in FIG. 2, the pass bands of the filter elements 22A, 22C and 22D do not overlap with one another, and the pass bands of the filter elements 22B, 22C and 22D do not overlap with one another. The pass band of the filter element 22A and the pass band of the filter element 22B at least partly overlap with each other.

The switch circuit 21 is a first switch circuit having a common terminal 21c and select terminals 21s1 and 21s2. The common terminal 21c is connected to the antenna common terminal 20, the select terminal 21s1 is connected to the filter element 22A, and the select terminal 21s2 is connected to the filter element 22B. The switch circuit 21 switches over connection between the common terminal 21c and the select terminal 21s1 and connection between the common terminal 21c and the select terminal 21s2 in accordance with a control signal S2 from the RFIC 4.

When a radio frequency front-end circuit of related art is used in a multimode/multiband compatible system allowing selective propagation of radio frequency signals in three or more frequency bands with intent to bundle three or more signal paths corresponding to the frequency bands together at an antenna common terminal, a switch circuit of SPnT (n≥3) type having three or more select terminals, or a demultiplexer for demultiplexing a radio frequency signal into three or more frequency bands is connected to the antenna common terminal.

In contrast, in the RF front-end circuit 2 according to this embodiment, the switch circuit 21 of SPDT (Single Pole Double Throw) type is disposed between the antenna common terminal and both the filter elements 22A and 22B, which have the overlapping pass bands, to be adapted for the multimode/multiband compatible system having the above-described four frequency bands. Furthermore, since the frequency bands of Band C and Band D are apart from each other, a switch element or a demultiplexer for exclusively selecting one signal path is not needed between the antenna common terminal 20 and both the filter elements 22C and 22D. Accordingly, the filter elements 22C and 22D having the pass bands apart from each other are directly connected to the antenna common terminal 20. With such a configuration, the number of select terminals of the switch circuit connected to the antenna common terminal 20 can be reduced and reduction in the circuit size and cost can be realized, while attenuations in the other frequency bands and isolation between the adjacent signal paths are ensured.

Here, the filter elements 22A to 22D can be any of a surface acoustic wave filter, an acoustic wave filter using BAW (Bulk Acoustic Wave), an LC resonance filter, and a dielectric filter. By using such a filter, the size of the filter element can be reduced, and the reduction in the circuit size and cost can be realized.

The switch circuit 21 can be constituted by a FET (Field Effect Transistor) switch made of GaAs or CMOS (Complementary Metal Oxide Semiconductor), or a diode switch. By using such a switch, the number of components constituting the SPDT switch circuit 21 can be significantly reduced in comparison with that needed in a SP4T switch, and the reduction in the circuit size and cost can be realized.

While the above embodiment has been described, by way of example, in connection with the case in which the frequency bands of Band A and Band B are partly overlapped with each other, the frequency bands of Band A and Band B may be in a not-overlapping relation. More specifically, the configuration of the RF front-end circuit 2 according to this embodiment can be further applied to the case in which a frequency interval between a first pass band given by the pass band of the filter element 22A and a second pass band given by the pass band of the filter element 22B is not more than 3% of a center frequency between the first pass band and the second pass band. Here, the frequency interval between the first pass band and the second pass band is defined as a frequency difference between a higher frequency end of the first pass band and a lower frequency end of the second pass band on an assumption that the first pass band is present on the lower frequency side than the second pass band.

While the RF front-end circuit 2 according to this embodiment has been described, by way of example, in connection with the case of four frequency bands, the present disclosure is not limited to that case. The RF front-end circuit according to the present disclosure can be applied to the case of including three or more signal paths corresponding to three or more frequency bands. In other words, the RF front-end circuit according to the present disclosure includes the antenna common terminal 20 connected to the antenna element, the SPDT switch circuit 21 having the common terminal 21*c* and the select terminals 21*s*1 and 21*s*2, and three or more filter elements allowing radio frequency signals in different frequency bands to pass therethrough. The common terminal 21*c* and one or more among the three or more filter elements are connected to the antenna common terminal 20. A first filter element and a second filter element among the three or more filter elements except for the one or more filter elements are connected to the select terminals 21*s*1 and 21*s*2 in a one-to-one relation. The one or more filter elements and the first filter element do not overlap in pass band with each other, and the one or more filter elements and the second filter element do not overlap in pass band with each other. The first pass band given by a pass band of the first filter element and the second pass band given by a pass band of the second filter element at least partly overlap with each other. As an alternative, a frequency interval between the first pass band and the second pass band is not more than 3% of a center frequency between the first pass band and the second pass band. With such a configuration, the number of select terminals of the switch circuit connected to the antenna common terminal 20 can be reduced and the reduction in the circuit size and cost can be realized, while attenuations in the other frequency bands and isolation between the adjacent signal paths are ensured. A configuration including three frequency bands is provided, for example, by modifying the RF front-end circuit 2 illustrated in FIG. 1 into an RF front-end circuit constituted by Band A, Band B, Band C (or Band D) with omission of Band C or Band D.

In the RF front-end circuit 2 according to this embodiment, the antenna common terminal 20 is described as being directly connected to the switch circuit 21 and the filter elements 22C and 22D. Here, the expression "directly connected" implies that a circuit of controlling a signal path, such as a switch circuit or a demultiplexer, is not disposed between the antenna common terminal 20 and any of the switch circuit 21 and the filter elements 22C and 22D, and includes the case in which an impedance matching element, such as an inductance element or a capacitance element, is disposed between the antenna common terminal 20 and any of the switch circuit 21 and the filter elements 22C and 22D.

[1.2 Configuration of RF Front-End Circuit According to Modification 1]

Figure 3:
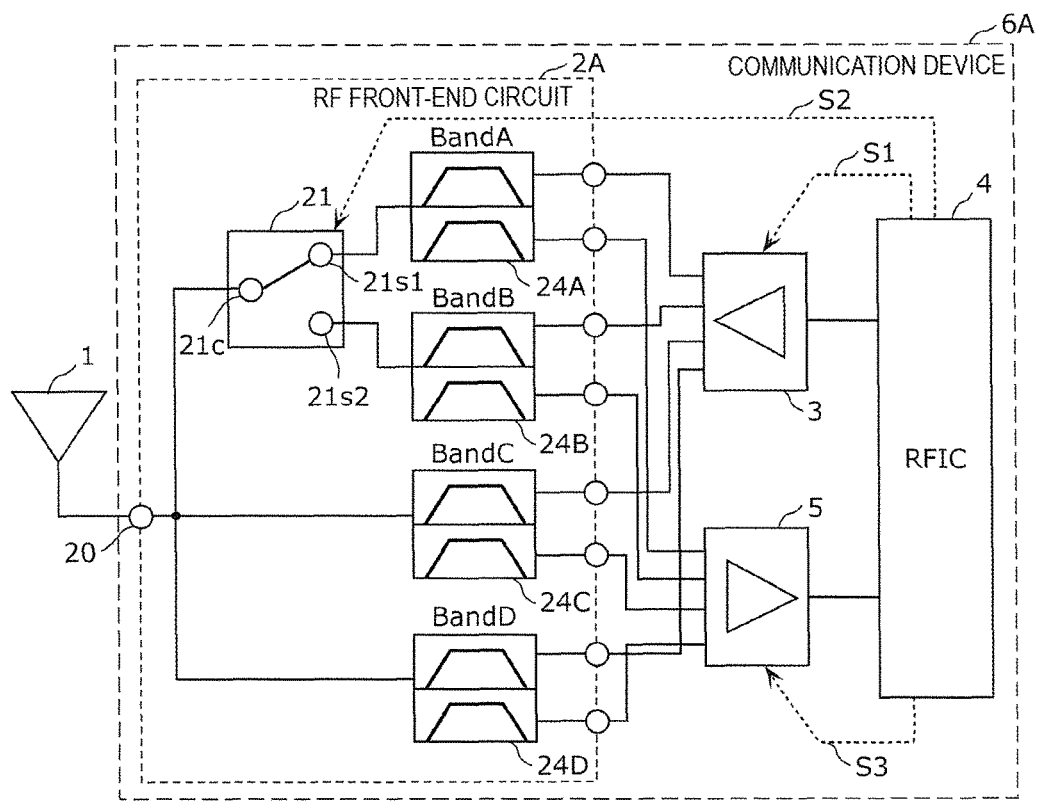
FIG. 3 is a circuit block diagram of a communication device according to Modification 1 of Embodiment 1.

FIG. 3 is a circuit block diagram of a communication device 6A according to Modification 1 of Embodiment 1. An antenna element 1 and the communication device 6A are illustrated in FIG. 3. The communication device 6A includes an RF front-end circuit 2A, power amplifier circuits 3 and 5, and an RFIC 4. A configuration of the RF front-end circuit 2A illustrated in FIG. 3 is different from the configuration of the RF front-end circuit 2 according to Embodiment 1 in including a received signal path in addition to a transmitted signal path, and including duplexers 24A to 24D instead of the filter elements 22A to 22D for transmission. In the following, description of the same points as those in the RF front-end circuit 2 according to Embodiment 1 is omitted, and different points are primarily described.

The RFIC 4 executes signal processing on a transmitted baseband signal, which is input, for example, from a baseband signal processing circuit (not illustrated), through up-conversion, etc., and outputs a transmitted radio frequency signal produced through the signal processing to the power amplifier circuit 3. Furthermore, the RFIC 4 executes signal processing on a received radio frequency signal, which is received by the antenna element 1 and transferred via the RF front-end circuit 2A and the power amplifier circuit 5, through down-conversion, etc., and outputs a resulting received signal to a baseband signal processing circuit. In addition, the RFIC 4 functions as a control unit for controlling the power amplifier circuits 3 and 5 and connection states of switch circuits in the RF front-end circuit 2A depending on a frequency band to be used.

The power amplifier circuit 3 is a power amplifier for amplifying power of the transmitted radio frequency signal output from the RFIC 4, and it outputs the transmitted radio frequency signal after having been amplified to one among a plurality of signal paths in the RF front-end circuit 2A in accordance with a control signal S1 from the RFIC 4.

The power amplifier circuit 5 is a low-noise amplifier for amplifying power of the received radio frequency signal, which is output from one among the plurality of signal paths in the RF front-end circuit 2A, in accordance with a control signal S3 from the RFIC 4, and it outputs the received radio frequency signal after having been amplified to the RFIC 4.

The RF front-end circuit 2A is a radio frequency front-end circuit including the antenna common terminal 20, the switch circuit 21, and the duplexers 24A, 24B, 24C and 24D. Thus, the RF front-end circuit 2A has four signal paths through which the transmitted radio frequency signals and received radio frequency signals in predetermined frequency bands pass selectively. One signal path is constituted by a transmitted signal path through which the transmitted radio frequency signal passes, and a received signal path through which the received radio frequency signal passes. In more detail, the transmitted radio frequency signal in Band A is output to the antenna element 1 through a signal path passing the RFIC 4, the power amplifier circuit 3, a transmission-side filter of the duplexers 24A, the switch circuit 21, and the antenna common terminal 20. The received radio frequency signal in Band A is output from the antenna element 1 to the power amplifier circuit 5 and the RFIC 4 through a signal path passing the antenna common terminal 20, the switch circuit 21, and a reception-side filter of the duplexers 24A. The transmitted radio frequency signals and the received radio frequency signals in Bands B to D are also bi-directionally transferred through corresponding signal paths as with the above-described signal paths for Band A.

As an alternative, the RF front-end circuit 2A may include the power amplifier circuits 3 and 5.

The duplexer 24A is a first filter element including a bandpass transmission filter and a bandpass reception filter allowing respectively the transmitted signal and the received signal in the frequency band of Band A to pass selectively therethrough. The duplexer 24B is a second filter element including a bandpass transmission filter and a bandpass reception filter allowing respectively the transmitted signal and the received signal in the frequency band of Band B to pass selectively therethrough. The duplexer 24C is a filter element including a bandpass transmission filter and a bandpass reception filter allowing respectively the transmitted signal and the received signal in the frequency band of Band C to pass selectively therethrough. The duplexer 24D is a filter element including a bandpass transmission filter and a bandpass reception filter allowing respectively the transmitted signal and the received signal in the frequency band of Band D to pass selectively therethrough. To be adapted for the frequency band allocation illustrated in FIG. 2, the transmission pass bands of the duplexers 24A, 24C and 24D do not overlap with one another, and the transmission pass bands of the duplexers 24B, 24C and 24D do not overlap with one another. The transmission pass band of the duplexer 24A and the transmission pass band of the duplexer 24B at least partly overlap with each other. Moreover, the reception pass bands of the duplexers 24A, 24C and 24D do not overlap with one another, and the reception pass bands of the duplexers 24B, 24C and 24D do not overlap with one another. The reception pass band of the duplexer 24A and the reception pass band of the duplexer 24B at least partly overlap with each other.

The switch circuit 21 is a first switch circuit having a common terminal 21c and select terminals 21s1 and 21s2. The common terminal 21c is connected to the antenna common terminal 20, the select terminal 21s1 is connected to the duplexer 24A, and the select terminal 21s2 is connected to the duplexer 24B. The switch circuit 21 switches over connection between the common terminal 21c and the select terminal 21s1 and connection between the common terminal 21c and the select terminal 21s2 in accordance with a control signal S2 from the RFIC 4.

In the RF front-end circuit 2A according to Modification 1, the switch circuit 21 of SPDT (Single Pole Double Throw) type is disposed between the antenna common terminal 20 and both the duplexers 24A and 24B, which have the overlapping pass bands, to be adapted for the multimode/multiband compatible system having the above-described four frequency bands. Furthermore, since the frequency bands of Band C and Band D are apart from each other, a switch element or a demultiplexer for exclusively selecting one signal path is not needed between the antenna common terminal 20 and both the duplexers 24C and 24D. Accordingly, the duplexers 24C and 24D having the pass bands apart from each other are directly connected to the antenna common terminal 20. With such a configuration, the number of select terminals of the switch circuit connected to the antenna common terminal 20 can be reduced and the reduction in the circuit size and cost can be realized, while attenuations in the other frequency bands and isolation between the adjacent signal paths are ensured.

[1.3 Configuration of RF Front-End Circuit According to Modification 2]

Figure 4:
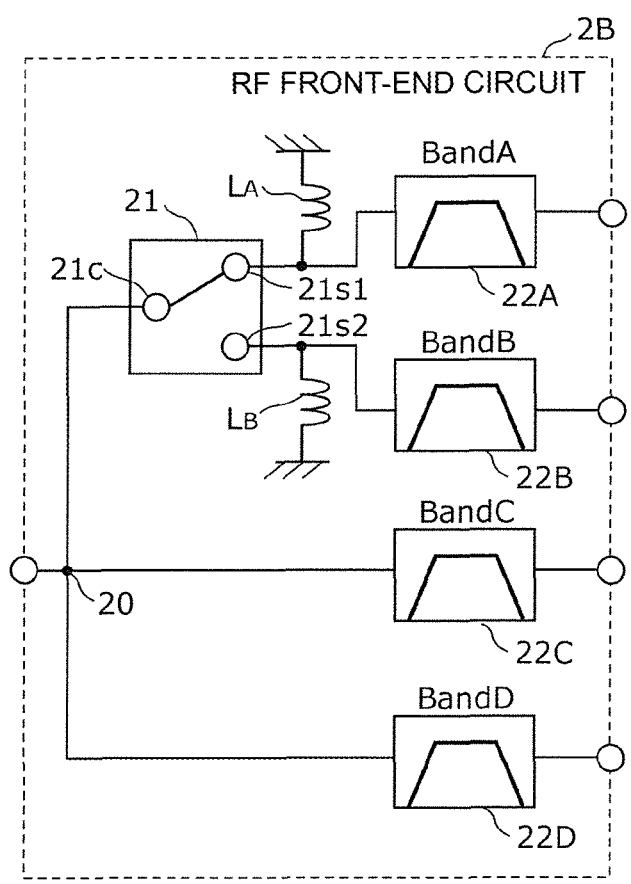
FIG. 4 is a circuit block diagram of an RF front-end circuit according to Modification 2 of Embodiment 1.

FIG. 4 is a circuit block diagram of an RF front-end circuit 2B according to Modification 2 of Embodiment 1. A configuration of the RF front-end circuit 2B illustrated in FIG. 4 is different from the configuration of the RF front-end circuit 2 according to Embodiment 1 in including a matching element between the switch circuit 21 and each of the filter elements 22A and 22B. In the following, description of the same points as those in the RF front-end circuit 2 according to Embodiment 1 is omitted, and different points are primarily described.

The RF front-end circuit 2B includes the antenna common terminal 20, the switch circuit 21, the filter elements 22A, 22B, 22C and 22D, and inductors $L_A$ and $L_B$.

The inductor $L_A$ constitutes a first impedance matching circuit connected to a connection node between the select terminals 21s1 of the switch circuit 21 and the filter element 22A. The inductor $L_B$ constitutes a second impedance matching circuit connected to a connection node between the select terminals 21s2 of the switch circuit 21 and the filter element 22B. Here, an inductance value of the inductor $L_A$ and an inductance value of the inductor $L_B$ are different from each other.

In the configuration of the RF front-end circuit 2B according to Modification 2, an inductor constituting an impedance matching circuit is disposed between the select terminal and the filter element instead of being disposed between the antenna common terminal 20 and the common terminal 21c. Therefore, a first complex impedance looking at the filter element side from the antenna common terminal 20 when the filter elements 22A, 22C, and 22D are connected to the antenna common terminal 20 can be made different from a second complex impedance looking at the filter element side from the antenna common terminal 20 when the filter elements 22B, 22C, and 22D are connected to the antenna common terminal 20. As a result, impedance matching can be established separately for each of the filter elements 22A and 22B responding to switching of the switch circuit 21.

The impedance matching circuits disposed between the switch circuit 21 and the filter elements 22A and 22B are not limited to the inductors shunt-connected as in this example, and they may be inductors connected in series to the switch circuit 21 and the filter elements 22A and 22B. In another example, a capacitance element may be used instead of an inductance element. A composite circuit including an inductance element and a capacitance element may also be used.

[1.4 Configuration of RF Front-End Circuit According to Modification 3]

Figure 5:
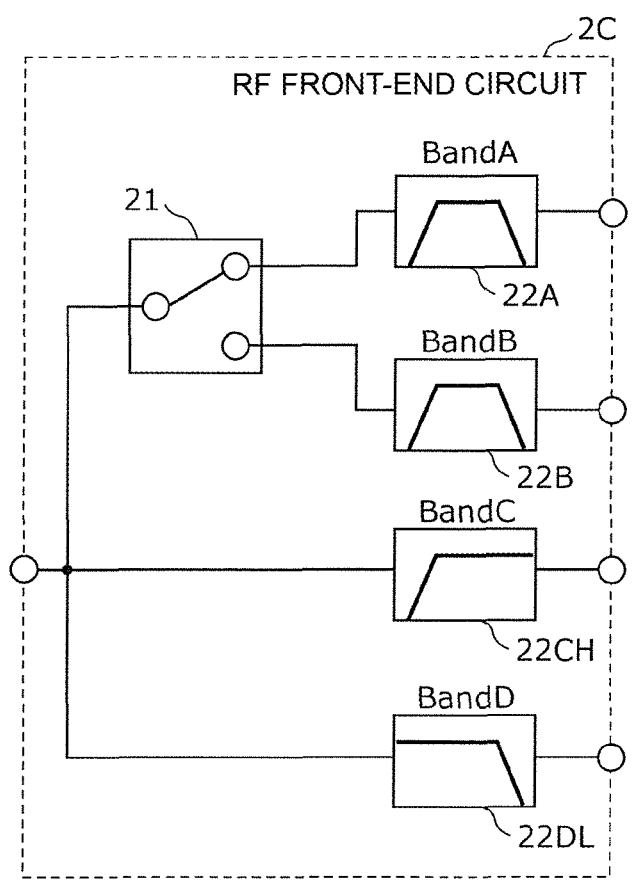
FIG. 5 is a circuit block diagram of an RF front-end circuit according to Modification 3 of Embodiment 1.

FIG. 5 is a circuit block diagram of an RF front-end circuit 2C according to Modification 3 of Embodiment 1. A configuration of the RF front-end circuit 2C illustrated in FIG. 5 is different from the configuration of the RF front-end circuit 2 according to Embodiment 1 in that a filter for Band C is constituted by a high pass filter element 22CH, and that a filter for Band D is constituted by a low pass filter element 22DL. In the following, description of the same points as those in the RF front-end circuit 2 according to Embodiment 1 is omitted, and different points are primarily described.

The RF front-end circuit 2C includes the antenna common terminal 20, the switch circuit 21, and the filter elements 22A, 22B, 22CH and 24DL. Thus, the RF front-end circuit 2C has four signal paths through which radio frequency signals in predetermined frequency bands pass selectively. The filter element 22CH is a high pass filter allowing selective passage of higher frequency, i.e., the frequency band of Band C, and the filter element 22DL is a low pass filter allowing selective passage of lower frequency, i.e., the frequency band of Band D.

Band D is positioned on the lower frequency side than Band A and Band B, and Band C is positioned on the higher frequency side than Band A and Band B. According to such frequency allocation, the pass bands of the filter elements 22A, 22CH and 22DL do not overlap with one another, and the pass bands of the filter elements 22B, 22CH and 22DL do not overlap with one another. The pass band of the filter element 22A and the pass band of the filter element 22B at least partly overlap with each other.

In the RF front-end circuit 2C according to Modification 3, the SPDT switch circuit 21 is disposed between the antenna common terminal 20 and both the filter elements 22A and 22B that have the overlapping pass bands. Furthermore, since Band C and Band D are apart from each other with Band A and Band B interposed therebetween, a switch element or a demultiplexer for exclusively selecting one signal path is not needed between the antenna common terminal 20 and both the filter elements 22CH and 22DL. Accordingly, the filter elements 22CH and 22DL having the frequency bands apart from each other may be directly connected to the antenna common terminal 20. With such a configuration, the number of select terminals of the switch circuit connected to the antenna common terminal 20 can be reduced and the reduction in the circuit size and cost can be realized, while attenuations in the other frequency bands and isolation between the adjacent signal paths are ensured.

Embodiment 2

An RF front-end circuit according to Embodiment 2 is different from the RF front-end circuit according to Embodiment 1 in that terminals of three or more filter elements on the side opposite to the antenna side are bundled together by switch circuits, and that at least one of the three or more filter elements is constituted by a frequency variable filter.

[2.1 Configuration of RF Front-End Circuit]

Figure 6:
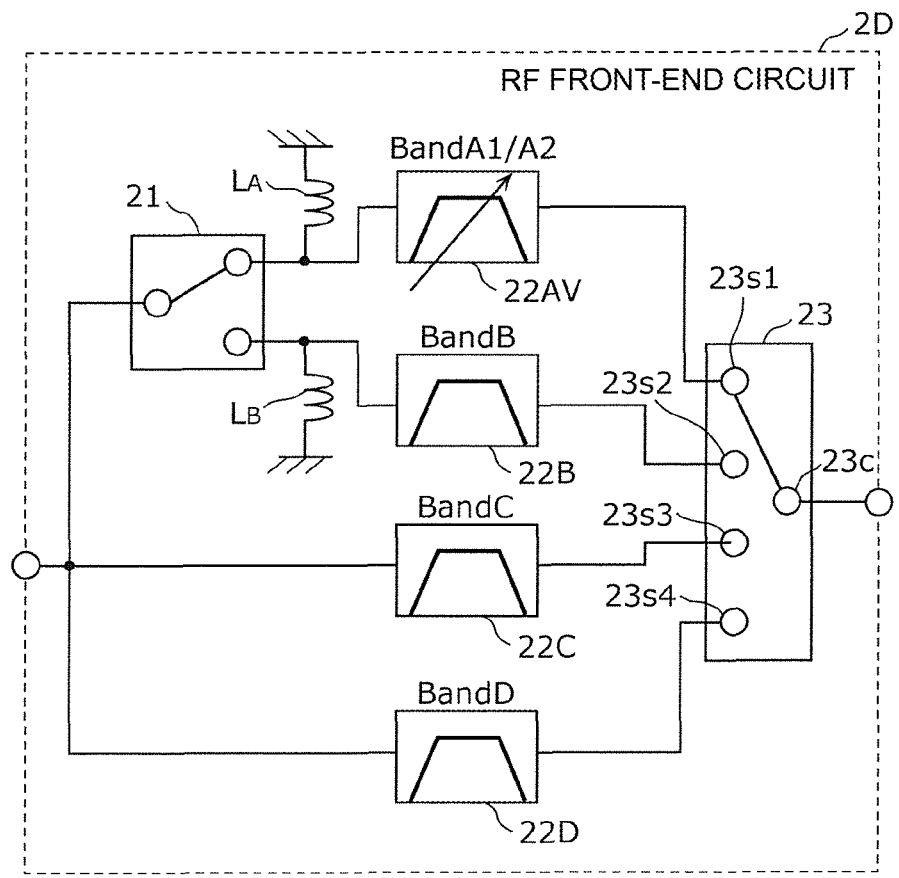
FIG. 6 is a circuit block diagram of an RF front-end circuit according to Embodiment 2.

FIG. 6 is a circuit block diagram of an RF front-end circuit 2D according to Embodiment 2. The RF front-end circuit 2D illustrated in FIG. 6 is different from the RF front-end circuit 2B according to Modification 2 of Embodiment 1 in that the filter element for Band A is a frequency variable filter, and that a SPOT switch circuit is additionally disposed on the side of the four filter elements opposite to the antenna side. In the following description of the RF front-end circuit 2D according to this embodiment, the same points as those in the RF front-end circuit 2B according to Modification 2 of Embodiment 1 are omitted, and different points are primarily described.

The RF front-end circuit 2D includes the antenna common terminal 20, two switch circuits 21 and 23, four filter elements 22AV, 22B, 22C and 22D, and the inductors $L_A$ and $L_B$.

Band A is subdivided into Bands A1 and A2, and Bands A1 and A2 are exclusively selected. Bands A1 and A2 may be each a frequency band resulting from subdividing Band A, or may be one or a plurality of adjacent ones among channels set in Band A.

The filter element 22AV is a frequency variable filter capable of changing a pass band corresponding to Band A1 and a pass band corresponding to Band A2. A configuration of the frequency variable filter is described later.

The switch circuit 23 is a second switch circuit having a common terminal 23c and select terminals 23s1 to 23s4, the select terminals 23s1 to 23s4 being connected to terminals (input terminals) of the four filter elements on the side opposite to the antenna common terminal 20 in a one-to-one relation. With the provision of the switch circuit 23, attenuations in the other frequency bands and isolation characteristics between the adjacent frequency bands can be improved. Furthermore, terminals for connecting the four filter elements to the RFIC 4 are integrated by the switch circuit 23. As a result, the number of terminals of the RFIC 4 can be reduced, and simplification and cost reduction of the RFIC 4 can be realized.

[2.2 Configuration of RF Front-End Circuit According to Modification 1]

Figure 7:
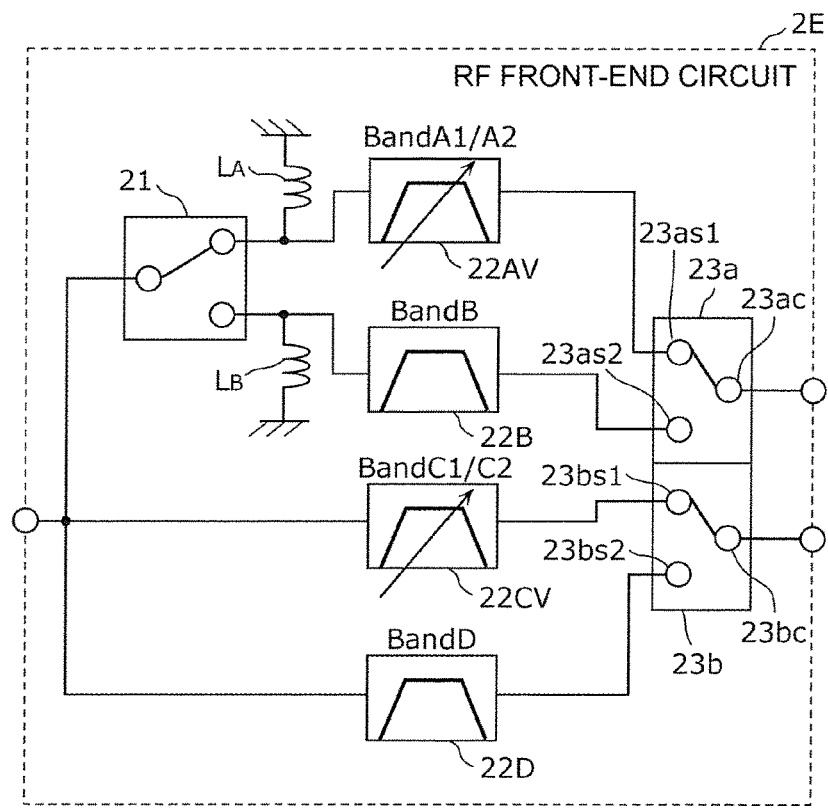
FIG. 7 is a circuit block diagram of an RF front-end circuit according to Modification 1 of Embodiment 2.

FIG. 7 is a circuit block diagram of an RF front-end circuit 2E according to Modification 1 of Embodiment 2. The RF front-end circuit 2E illustrated in FIG. 7 is different from the RF front-end circuit 2D according to Embodiment 2 in that the filter element for Band C is a frequency variable filter, and that two SPDT switch circuits are disposed instead of the SPOT switch circuit on the side of the four filter elements opposite to the antenna side. In the following description of the RF front-end circuit 2E according to this embodiment, the same points as those in the RF front-end circuit 2D according to Embodiment 2 are omitted, and different points are primarily described.

The RF front-end circuit 2E includes the antenna common terminal 20, three switch circuits 21, 23a and 23b, four filter elements 22AV, 22B, 22CV and 22D, and the inductors $L_A$ and $L_B$.

Band C is subdivided into Bands C1 and C2, and Bands C1 and C2 are exclusively selected. Bands C1 and C2 may be each a frequency band resulting from subdividing Band C, or may be one or a plurality of adjacent ones among channels set in Band C.

The filter element 22CV is a frequency variable filter capable of changing a pass band corresponding to Band C1 and a pass band corresponding to Band C2. A configuration of the frequency variable filter is described later.

The switch circuit 23a is a second switch circuit having a common terminal 23ac and select terminals 23as1 and 23as2, the select terminals 23as1 and 23as2 being connected to terminals (input terminals) of the two filter elements 22AV and 22B on the side opposite to the antenna common terminal 20 in a one-to-one relation. The switch circuit 23b is a second switch circuit having a common terminal 23bc and select terminals 23bs1 and 23bs2, the select terminals 23bs1 and 23bs2 being connected to terminals (input terminals) of the two filter elements 22CV and 22D on the side opposite to the antenna common terminal 20 in a one-to-one relation. With the provision of the switch circuits 23a and 23b, attenuations in the other frequency bands and isolation characteristics between the adjacent frequency bands can be improved. Furthermore, terminals for connecting the two filter elements to the RFIC 4 are integrated by the switch circuits 23a and 23b. As a result, the number of terminals of the RFIC 4 can be reduced, and simplification and cost reduction of the RFIC 4 can be realized. In addition, by selecting one of Band A and Band B and selecting one of Band C and Band D simultaneously, this modification can be applied to the so-called carrier aggregation utilizing two bands at the same time.

[2.3 Configuration of Frequency Variable Filter]

The configuration of the frequency variable filter used as each of the filter element 22AV in the RF front-end circuit 2D and the filter elements 22AV and 22CV in the RF front-end circuit 2 E will be described in detail below.

Although the following description is made about the filter element 22AV, it is similarly applied to the filter element 22CV as well.

Figure 8:
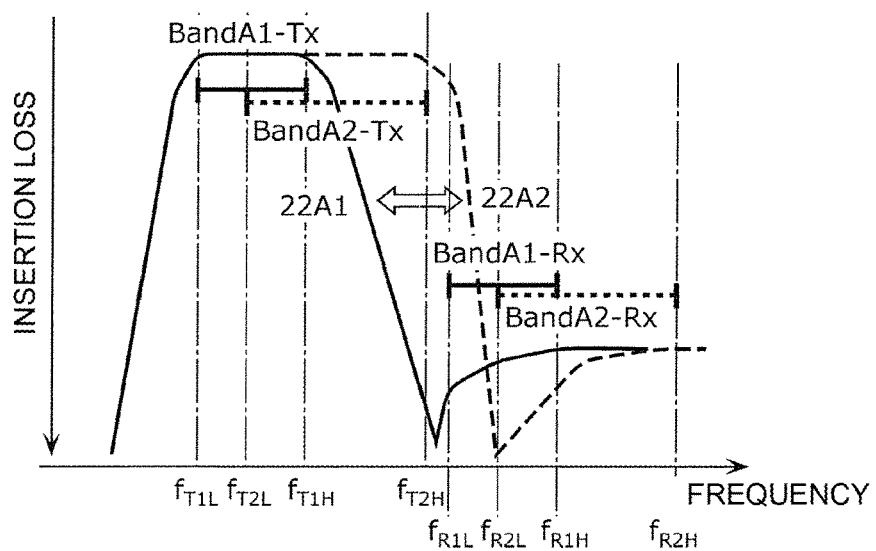
FIG. 8 is a chart referenced to explain relations between bandpass characteristics of a frequency variable filter according to Embodiment 2 and allocated frequency bands.

FIG. 8 is a chart referenced to explain relations between bandpass characteristics of the filter element 22AV according to Embodiment 2 and allocated frequency bands. As seen from FIG. 8, a transmission band of Band A1 is $f_{T1L}$ to $f_{T1H}$, and a transmission band of Band A2 is $f_{T2L}$ to $f_{T2H}$. Here, the transmission band of Band A1 and the transmission band of Band A2 overlap with each other in $f_{T2L}$ to $f_{T1H}$. A higher frequency end $f_{T2H}$ of the transmission band of Band A2 is higher than a higher frequency end $f_{T1H}$ of the transmission band of Band A1. On the other hand, a reception band of Band A1 is $f_{R1L}$ to $f_{R1H}$, and a reception band of Band A2 is $f_{R2L}$ to $f_{R2H}$. Here, the reception band of Band A1 and the reception band of Band A2 overlap with each other in $f_{R2L}$ to $f_{R1H}$. Moreover, a frequency interval between the higher frequency end $f_{T2H}$ of the transmission band of Band A2 and a lower frequency end $f_{R1L}$ of the reception band of Band A1 is very small or not present due to overlapping of both the frequency ends. In the above-described frequency allocation, Band A1 and Band A2 are selectively used in an exclusive way.

In trying to constitute a transmission-side filter in conformity the above-described frequency specifications of Band A1 and Band A2, the bandpass characteristics depicted in FIG. 8 are demanded to ensure a low loss in each transmission band and a satisfactory attenuation in each reception band. In other words, characteristics represented by a solid line in FIG. 8 are demanded as the bandpass characteristics of the transmission-side filter for Band A1, and characteristics represented by a dashed line in FIG. 8 are demanded as the bandpass characteristics of the transmission-side filter for Band A2. More specifically, it is required to shift the higher frequency side of the in-band bandpass characteristics of the transmission-side filter for Band A1 toward the lower frequency side relative to the in-band bandpass characteristics of the transmission-side filter for Band A2, and to narrow a band width of the transmission-side filter for Band A1.

In consideration of the above-described demanded filter characteristics, the frequency variable filter element 22AV is implemented with a simple and small-sized configuration by switching over bandpass characteristics 22A1 demanded for Band A1 and bandpass characteristics 22A2 demanded for Band A2 in a tunable manner.

Here, a state that "frequency bands are close to or partly overlapped with each other" in two Bands is not limited to the case in which pass bands are partly overlapped as in Band A1 and Band A2 illustrated in FIG. 8. The above state includes the case in which, even though two Bands are apart away from each other, those two Bands have a frequency relation, for example, that a frequency interval between the two Bands is within several percentages of a center frequency of the two Bands (i.e., an average frequency of respective center frequencies of the two Bands).

Figure 9:
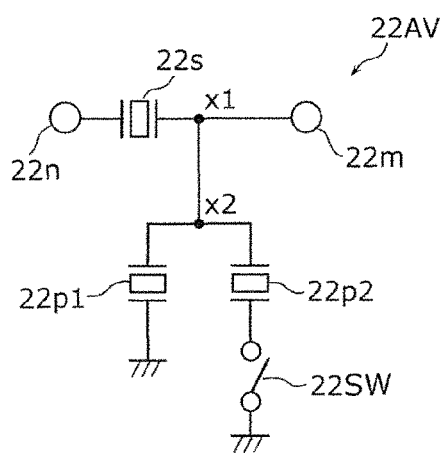
FIG. 9 is a circuit block diagram illustrating an example of a frequency variable filter according to Embodiment 2.

FIG. 9 is a circuit block diagram of the filter element 22AV according to Embodiment 2. The filter element 22AV illustrated in FIG. 9 is a frequency variable filter including a serial arm resonator 22s, parallel arm resonators 22p1 and 22p2, a switch 22SW, an input terminal 22m (first input/output terminal), and an output terminal 22n (second input/output terminal).

The serial arm resonator 22s is connected between the input terminal 22m and the output terminal 22n.

The parallel arm resonator 22p1 is a first parallel arm resonator connected between a node x1 and a ground (reference) terminal, the node x1 being present on a path interconnecting the input terminal 22m, the serial arm resonator 22s, and the output terminal 22n.

The parallel arm resonator 22p2 is a second parallel arm resonator connected between the node x1 and the ground terminal.

The switch 22SW is a switch element that is disposed between the node x1 and the ground terminal, and that switches over electrical continuity and discontinuity of the path interconnecting the node x1, the parallel arm resonator 22p2, and the ground terminal. In this embodiment, the switch 22SW is connected to the parallel arm resonator 22p2 and the ground terminal. The switch 22SW may be connected to a connection node x2 between the parallel arm resonators 22p1 and 22p2 and to the parallel arm resonator 22p2.

Here, a resonant frequency of the parallel arm resonator 22p2 is higher than that of the parallel arm resonator 22p1. Furthermore, the resonant frequency of the parallel arm resonator 22p2 is higher than that of the serial arm resonator 22s and lower than an anti-resonant frequency of the serial arm resonator 22s.

Thus, in the filter element 22AV in this embodiment, a circuit constituted by the parallel arm resonator 22p2 and the switch 22SW connected in series for the purpose of varying the frequency is connected in parallel to the parallel arm resonator 22p1 in a ladder filter that is constituted by the serial arm resonator 22s and the parallel arm resonator 22p1.

The switch 22SW may be, for example, a FET switch made of GaAs or CMOS, or a diode switch. Thus, the switch 22SW can be constituted by one FET switch or diode switch, and the filter element 22AV can be realized as a small-sized element.

In this embodiment, the serial arm resonator 22s and the parallel arm resonators 22p1 and 22p2 are each a resonator utilizing a surface acoustic wave. Thus, since the filter element 22AV can be constituted using IDT (InterDigital Transducer) electrodes formed on a piezoelectric substrate, the filter element 22AV can be realized as a small-sized and low-height filter element having highly steep bandpass characteristics. A structure of the surface acoustic resonator is described below.

Figure 10:
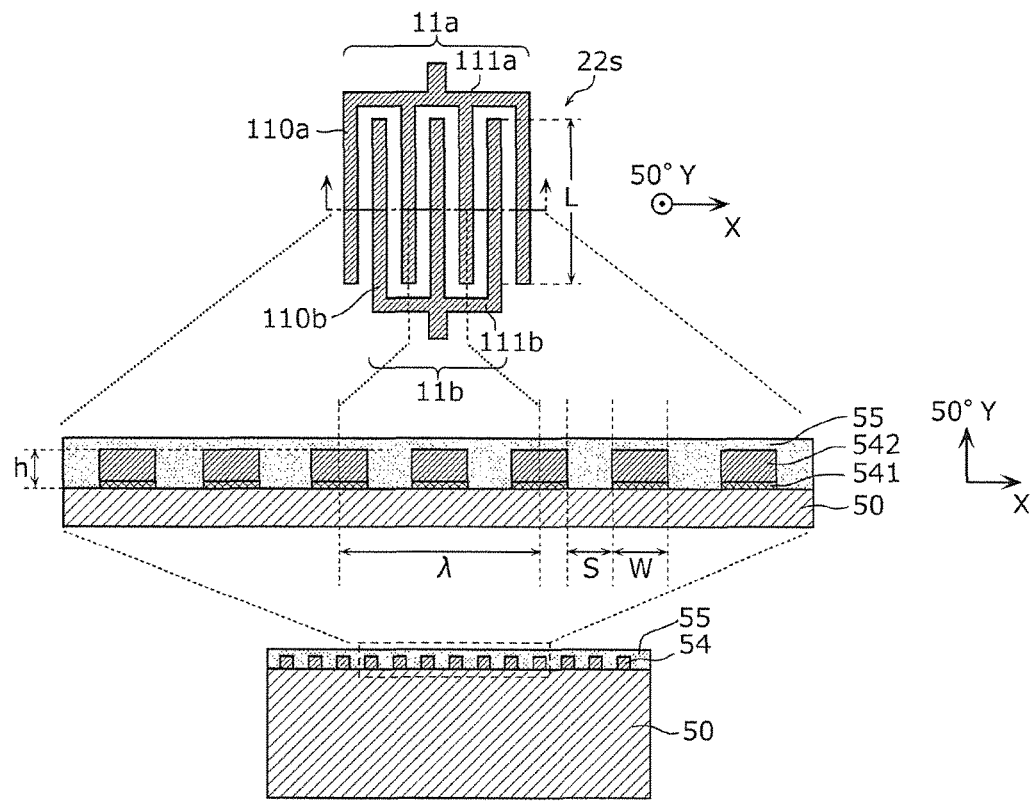
FIG. 10 presents a plan view and sectional views schematically illustrating an example of a resonator in the frequency variable filter according to Embodiment 2.

FIG. 10 presents a plan view and sectional views schematically illustrating an example of the resonator in the filter element 22AV according to Embodiment 2. More specifically, FIG. 10 presents a schematic plan view and schematic sectional views illustrating the structure of the serial arm resonator 22s among the serial arm resonator 22s and the parallel arm resonators 22p1 and 22p2, which constitute the filter element 22AV. It is to be noted that the serial arm resonator illustrated in FIG. 10 is merely intended to explain a typical structure of the above-described plural resonators, and that the number and the length of electrode fingers constituting each electrode are not limited to illustrated ones.

Each of the resonators in the filter element 22AV is constituted by a piezoelectric substrate 50 and IDT electrodes 11a and 11b having a comb-like shape.

As seen from the plan view of FIG. 10, the pair of IDT electrodes 11a and 11b opposing to each other is formed on the piezoelectric substrate 50. The IDT electrode 11a is constituted by a plurality of electrode fingers 110a parallel to one another, and a busbar electrode 111a interconnecting the electrode fingers 110a. The IDT electrode 11b is constituted by a plurality of electrode fingers 110b parallel to one another, and a busbar electrode 111b interconnecting the electrode fingers 110*b*. The electrode fingers 110*a* and 110*b* are formed to extend in a direction perpendicular to an X-axis direction.

As seen from the sectional views of FIG. 10, an IDT electrode 54 including the electrode fingers 110*a* and 110*b* and the busbar electrodes 111*a* and 111*b* has a multilayer structure made up of a close contact layer 541 and a main electrode layer 542.

The close contact layer 541 is a layer serving to increase adhesion between the piezoelectric substrate 50 and the main electrode layer 542. For example, Ti is used as a material of the close contact layer 541. A film thickness of the close contact layer 541 is 12 nm, for example.

For example, Al containing 1% of Cu is used as a material of the main electrode layer 542. A film thickness of the main electrode layer 542 is 162 nm, for example.

A protective layer 55 covers the IDT electrodes 11*a* and 11*b*. The protective layer 55 is a layer aiming to protect the main electrode layer 542 from external environments, to adjust frequency-temperature characteristics, and to enhance moisture resistance. The protective layer 55 is in the form of a film containing, for example, silicon dioxide as a main ingredient.

Materials of the close contact layer 541, the main electrode layer 542, and the protective layer 55 are not limited to the above-mentioned ones. Furthermore, the IDT electrode 54 is not always required to have the above-described multilayer structure. The IDT electrode 54 may be constituted, for example, using a metal such as Ti, Al, Cu, Pt, Au, Ag or Pd, or an alloy of any of those metals, or using a plurality of multilayer bodies each made of the above-mentioned metal or alloy. The protective layer 55 is not always required to be formed.

The piezoelectric substrate 50 is made of, for example, a 50° Y cut X SAW propagation $LiTaO_3$ piezoelectric single crystal or piezoelectric ceramic (i.e., a lithium tantalate single crystal obtained by cutting the single crystal along a plane having a normal line that is given by an axis rotated through 50° from a Y axis with an X axis being a center axis or ceramic, the single crystal or the ceramic allowing a surface acoustic wave to propagate in the X-axis direction). While, in this embodiment, the 50° Y cut X SAW propagation $LiTaO_3$ single crystal is used, by way of example, as the piezoelectric substrate 50, a material of the single crystal constituting the piezoelectric substrate 50 is not limited to $LiTaO_3$. The Cut Angle of the single crystal material is also not limited to the above-mentioned value.

The piezoelectric substrate 50 may be a substrate having piezoelectricity at least in its part. For instance, the piezoelectric substrate 50 may be constituted as a multilayer body made up of a film, a support substrate, etc., the film including a piezoelectric thin film formed on its surface and having an acoustic velocity different from that of the piezoelectric thin film. Alternatively, the substrate having piezoelectricity may be a piezoelectric substrate having piezoelectricity in the entire substrate as in this embodiment.

Design parameters of the IDT electrodes are described here. A wavelength of a surface acoustic wave resonator is specified by a repetition pitch λ, denoted in a middle zone of FIG. 10, of the electrode fingers 110*a* and 110*b* constituting respectively the IDT electrodes 11*a* and 11*b*. As denoted in an upper zone of FIG. 10, an intersecting width L of the IDT electrodes is given as an electrode finger length over which the electrode fingers 110*a* of the IDT electrode 11*a* and the electrode fingers 110*b* of the IDT electrode 11*b* overlap with each other when viewed from the X-axis direction. The number of pairs of the electrode fingers is equal to the number of the electrode fingers 110*a* or 110*b*. The repetition pitch λ, the intersecting width L, and the number of pairs of the electrode fingers in each of the serial arm resonator 22*s* and the parallel arm resonators 22*p*1 and 22*p*2 are determined depending on the specifications demanded for the pass bands of Band A1 and Band A2.

The structure of each resonator in the filter element 22AV according to the present disclosure is not limited to that illustrated in FIG. 10. In another example, the IDT electrode 54 may be formed as a single layer of a metal film instead of having the multilayer structure of metal films.

Although the serial arm resonator 22*s* and the parallel arm resonators 22*p*1 and 22*p*2 can be formed on the single piezoelectric substrate 50 from the viewpoint of reducing the size of the filter element 22AV, those resonators may be formed on separate substrates.

Furthermore, the serial arm resonator 22*s* and the parallel arm resonators 22*p*1 and 22*p*2 are not always required to be surface acoustic wave resonators, and they may be resonators utilizing BAW. In either case, since the filter element 22AV can be constituted as a piezoelectric element utilizing an acoustic wave, a small-sized frequency variable filter having highly steep bandpass characteristics can be realized. It is hence possible to reduce the size and the cost of the radio frequency front-end circuit including the frequency variable filter.

[2.4 Bandpass Characteristics of Frequency Variable Filter]

Figure 11A:
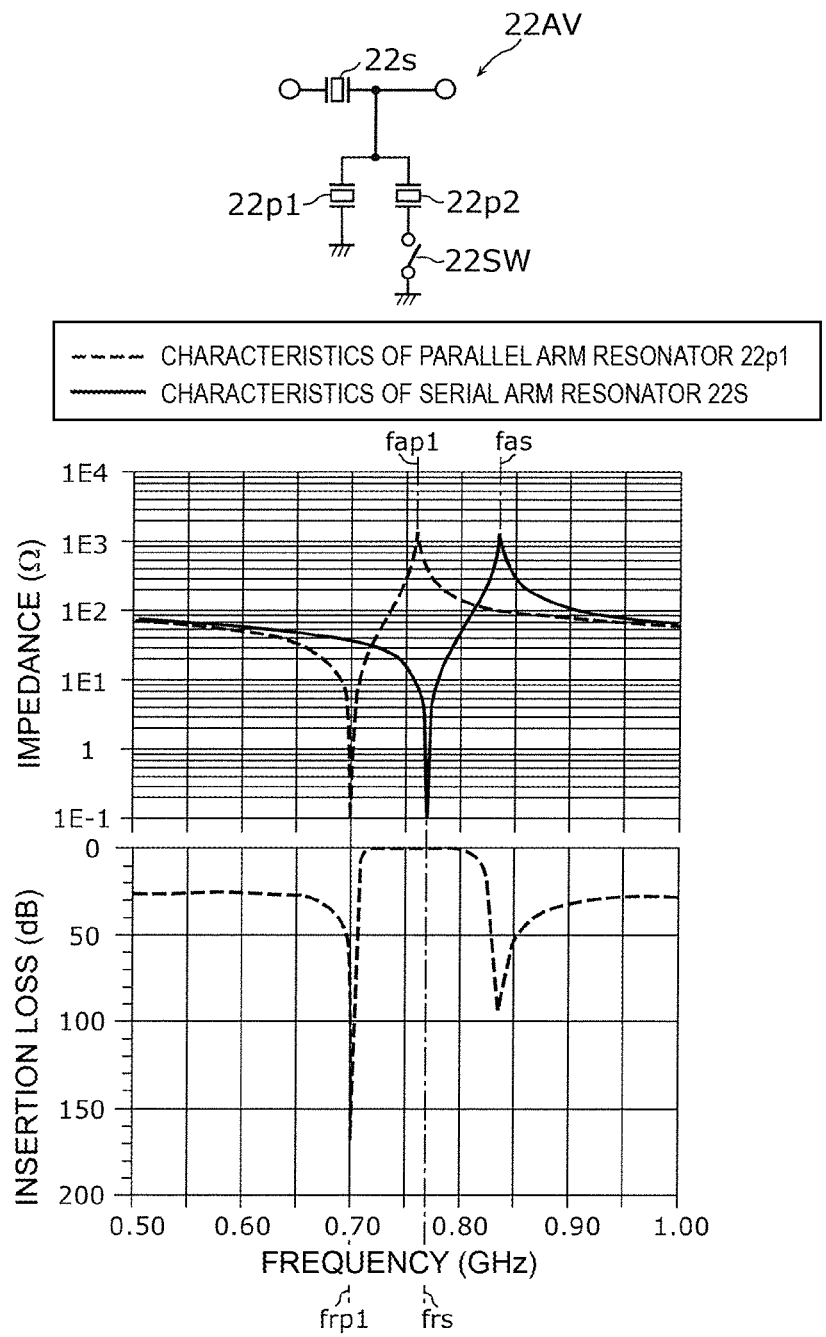
FIG. 11A is a graph representing impedance characteristics and bandpass characteristics of the frequency variable filter according to Embodiment 2 when a switch is turned off.
Figure 11B:
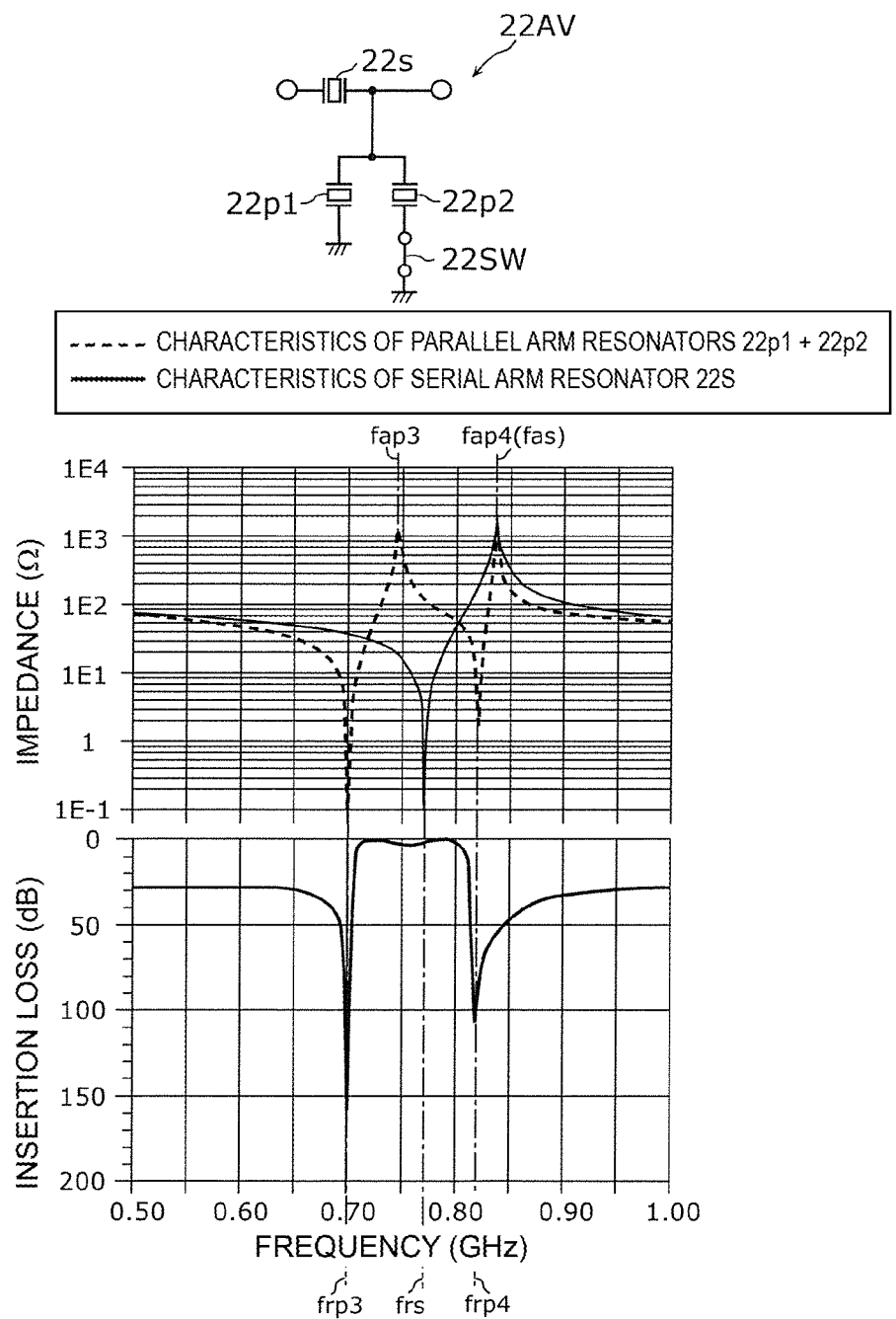
Figure 11C:
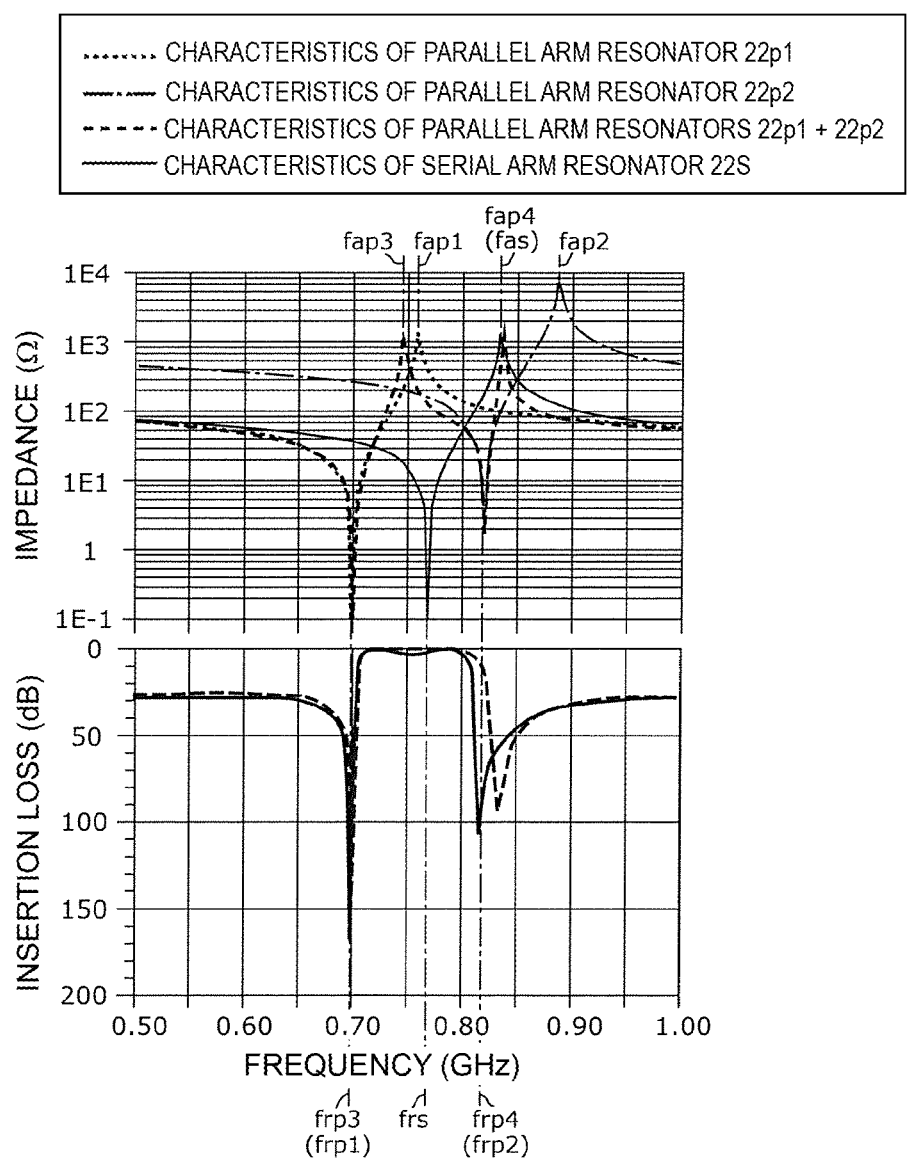

FIG. 11A is a graph representing impedance characteristics and bandpass characteristics of the filter element 22AV according to Embodiment 2 when the switch 22SW of the filter element 22AV is turned off. FIG. 11B is a graph representing impedance characteristics and bandpass characteristics of the filter element 22AV according to Embodiment 2 when the switch 22SW of the filter element 22AV is turned on. FIG. 11C is a graph comparatively representing the impedance characteristics and the bandpass characteristics of the filter element 22AV according to Embodiment 2 when the switch 22SW of the filter element 22AV is turned off and when the switch 22SW of the filter element 22AV is turned on.

The filter element 22AV according to this embodiment has one stage of ladder filter structure constituted by the serial arm resonator 22*s* and the parallel arm resonator 22*p*1. FIG. 11A represents impedance characteristics and bandpass characteristics of the ladder surface acoustic wave filter when the switch 22SW is turned off.

First, the principle of operation of the ladder surface acoustic wave filter constituted by the serial arm resonator 22*s* and the parallel arm resonator 22*p*1 is described with reference to FIG. 11A.

The parallel arm resonator 22*p*1 illustrated in FIG. 11A has a resonant frequency frp1 and an anti-resonant frequency fap1 (>frp1). The serial arm resonator 22*s* has a resonant frequency frs and an anti-resonant frequency fas (>frs>frp1). In constituting a bandpass filter using ladder resonators, the anti-resonant frequency fap1 of the parallel arm resonator 22*p*1 and the resonant frequency frs of the serial arm resonator 22*s* are set close to each other. With such setting, a lower frequency-side stop band is obtained near the resonant frequency frp1 at which the impedance of the parallel arm resonator 22*p*1 comes closer to 0. When the frequency increases from the resonant frequency frp1, the impedance of the parallel arm resonator 22*p*1 increases near the anti-resonant frequency fap1, and the impedance of the serial arm resonator 22*s* comes closer to 0 near the resonant frequency frs. As a result, near a range including the anti-resonant frequency fap1 and the resonant frequency frs, a signal pass band is obtained in a signal path extending from the input terminal 22m to the output terminal 22n. When the frequency further increases and comes close to the anti-resonant frequency fas, the impedance of the serial arm resonator 22s increases and a higher frequency-side stop band is obtained.

When a radio frequency signal is input through the input terminal 22m in the filter element 22AV of FIG. 11A, a potential difference is generated between the input terminal 22m and the ground terminal, whereupon a surface acoustic wave propagating in the X direction is generated due to distortion of the piezoelectric substrate 50. By setting the pitch λ of the IDT electrodes 11a and 11b to be substantially matched with the wavelength of the pass band, only a radio frequency signal having a frequency component to be passed is allowed to pass through the filter element 22AV.

On the other hand, FIG. 11B represents impedance characteristics and bandpass characteristics of the ladder surface acoustic wave filter when the switch 22SW is turned on. With the switch 22SW being turned on, a parallel resonance circuit in the ladder surface acoustic wave filter is constituted by the parallel arm resonators 22p1 and 22p2 connected in parallel. Thus, resonance points of the parallel resonance circuit constituted by the parallel arm resonators 22p1 and 22p2 connected in parallel are given by two points (see an upper graph in FIG. 11B) at resonant frequencies frp3 and frp4 in order from the lower frequency side. The resonant frequency frp3 indicates a resonance point reflecting the resonance characteristics of the parallel arm resonator 22p1, and it corresponds to an attenuation pole formed on the lower frequency side of the pass band of the one-stage ladder filter constituted by the serial arm resonator 22s and the parallel arm resonator 22p1. The resonant frequency frp4 indicates a resonance point reflecting the resonance characteristics of the parallel arm resonator 22p2, and it corresponds to an attenuation pole formed on the higher frequency side of the pass band in the above-described ladder filter structure. Here, a resonant frequency frp2 of the parallel arm resonator 22p2 (reflected on the resonant frequency frp4 of the parallel resonance circuit) is set to be higher than the resonant frequency frp1 of the parallel arm resonator 22p1 (reflected on the resonant frequency frp3 of the parallel resonance circuit). Moreover, the resonant frequency frp2 of the parallel arm resonator 22p2 is set to be higher than the resonant frequency frs of the serial arm resonator 22s and lower than the anti-resonant frequency fas of the serial arm resonator 22s.

The impedance characteristics and the bandpass characteristics when the switch 22SW in the filter element 22AV is turned off and when it is turned on will be compared in detail below with reference to FIG. 11C.

When the switch 22SW is turned off, the impedance of the parallel arm resonator 22p2 is substantially infinite, and the impedance characteristics of the filter element 22AV are given as combined impedance characteristics resulting from both impedance characteristics (denoted by a solid line in an upper graph of FIG. 11C) of the serial arm resonator 22s and impedance characteristics (denoted by a thin dashed line in the upper graph of FIG. 11C) of the parallel arm resonator 22p1. Therefore, when the switch 22SW is turned off, the filter element 22AV serves as a bandpass filter (denoted by a dashed line in a lower graph of FIG. 11C) having an attenuation pole on the lower frequency side at the resonant frequency frp1 of the parallel arm resonator 22p1, and an attenuation pole on the higher frequency side at the anti-resonant frequency fas of the serial arm resonator 22s.

On the other hand, when the switch 22SW is turned on, the impedance characteristics of the filter element 22AV are given as combined impedance characteristics resulting from both the impedance characteristics (denoted by the solid line in the upper graph of FIG. 11C) of the serial arm resonator 22s and impedance characteristics (denoted by a thick dashed line in the upper graph of FIG. 11C) of the parallel resonance circuit constituted by the parallel arm resonators 22p1 and 22p2 connected in parallel. Here, the impedance characteristics (denoted by the thick dashed line in the upper graph of FIG. 11C) of the parallel resonance circuit are given as combined impedance characteristics resulting from both the impedance characteristics (denoted by the thin dashed line in the upper graph of FIG. 11C) of the parallel arm resonator 22p1 and impedance characteristics (denoted by a one-dot-chain line in the upper graph of FIG. 11C) of the parallel arm resonator 22p2. Therefore, when the switch 22SW is turned on, the filter element 22AV serves as a bandpass filter (denoted by a solid line in the lower graph of FIG. 11C) having an attenuation pole on the lower frequency side at the resonant frequency frp3 of the parallel resonance circuit (frp3 reflecting the resonant frequency frp1 of the parallel arm resonator 22p1), and an attenuation pole on the higher frequency side at the resonant frequency frp4 of the parallel resonance circuit (frp4 reflecting the resonant frequency frp2 of the parallel arm resonator 22p2).

In addition, when the switch 22SW is turned on, the resonant frequency frp2 of the parallel arm resonator 22p2 is present on the higher frequency side than the resonant frequency frp1 of the parallel arm resonator 22p1. Therefore, an anti-resonant frequency fap3 of the parallel resonance circuit is shifted to the lower frequency side than the anti-resonant frequency fap1 of the parallel arm resonator 22p1, and an anti-resonant frequency fap4 of the parallel resonance circuit is shifted to the lower frequency side than the anti-resonant frequency fap2 of the parallel arm resonator 22p2. In other words, the anti-resonant frequency fap3 of the parallel resonance circuit is positioned on the lower frequency side than the anti-resonant frequency fap1 of the parallel arm resonator 22p1, and the resonant frequency frp4 of the parallel resonance circuit is positioned on the lower frequency side than the anti-resonant frequency fas of the serial arm resonator 22s. Accordingly, when the switch 22SW is turned on, the pass band width is narrowed toward the lower frequency side and the attenuation band is shifted toward the lower frequency side in comparison with those when the switch 22SW is turned off.

Stated in another way, according to the above-described configuration, the resonant frequency frp2 of the parallel arm resonator 22p2 is higher than the resonant frequency frs of the serial arm resonator 22s, which affects the insertion loss near the center frequency within the pass band, and is lower than the anti-resonant frequency fas of the serial arm resonator, which corresponds to the attenuation pole on the higher frequency side outside the pass band. Consequently, when the switch 22SW is turned on, the attenuation pole on the higher frequency side outside the pass band can be shifted toward the lower frequency side while the low loss within the pass band is maintained. Thus, since the higher frequency end of the pass band can be shifted toward the lower frequency side when the switch 22SW is turned on, the pass band width can be narrowed without necessarily reducing the steepness at the higher frequency end of the pass band.

The frequency variable filter according to the present disclosure is not limited to the case in which the resonant frequency frp2 of the parallel arm resonator 22p2 is higher than the resonant frequency frs of the serial arm resonator 22s and lower than the anti-resonant frequency fas of the serial arm resonator 22s. In other words, the resonant frequency frp2 of the parallel arm resonator 22p2 may be higher than the anti-resonant frequency fas of the serial arm resonator 22s. Even in such a case, by setting the resonant frequency frp2 of the parallel arm resonator 22p2 to be higher than the resonant frequency frp1 of the parallel arm resonator 22p1 as described above, the impedance at the higher frequency end of the pass band of the parallel resonance circuit becomes lower than that at the higher frequency end of the pass band of the parallel arm resonator 22p1. As a result, the band width of the filter element 22AV when the switch 22SW is turned on can be narrowed in comparison with that when the switch 22SW is turned off.

[2.5 Comparison with Related Art]

The filter element 22AV according to this embodiment is now compared with a frequency variable filter of related art.

Figure 12:
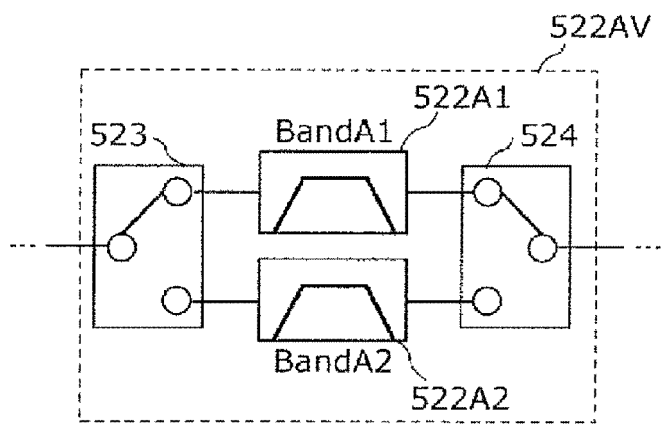
FIG. 12 is a circuit block diagram of a radio frequency filter circuit according to Comparative Example.

FIG. 12 is a circuit block diagram of a filter element 522AV according to Comparative Example. The filter element 522AV illustrated in FIG. 12 is a filter element of related art, and it includes a transmission-side filter 522A1 for Band A1, a transmission-side filter 522A2 for Band A2, and SPDT switch circuits 523 and 524. As illustrated in FIG. 12, in the filter element 522AV according to Comparative Example, a circuit for exclusively selecting one of two frequency bands of adjacent Band A1 and Band A2 requires two independent filter circuits and two SPDT switches. For example, four FET switches are needed to constitute one SPDT switch. Thus, two independent filter circuits and eight FET switches are needed in the circuit configuration of the filter element 522AV according to Comparative Example. Consequently, the circuit configuration is complicated, and the circuit size is increased.

In contrast, the filter element 22AV according to this embodiment can be constituted, as illustrated in FIG. 9, by one filter circuit made up of the serial arm resonator 22s and the parallel arm resonators 22p1 and 22p2, and one SPST switch 22SW. As a result, simplification and size reduction of the radio frequency front-end circuit can be realized.

[2.6 Configurations of Frequency Variable Filters According to Modifications 2 and 3]

Figure 13A:
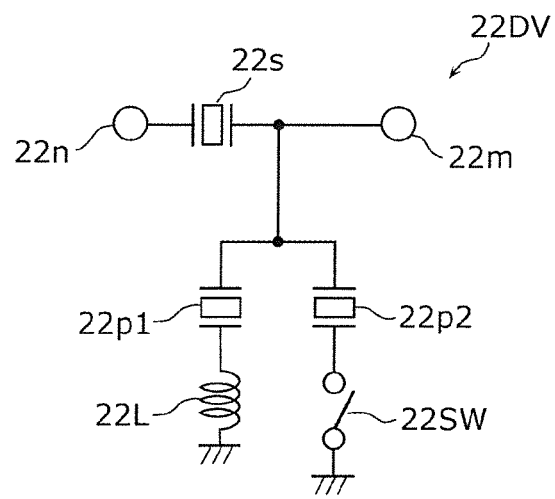
FIG. 13A is a circuit block diagram of a frequency variable filter according to Modification 2 of Embodiment 2.
Figure 13B:
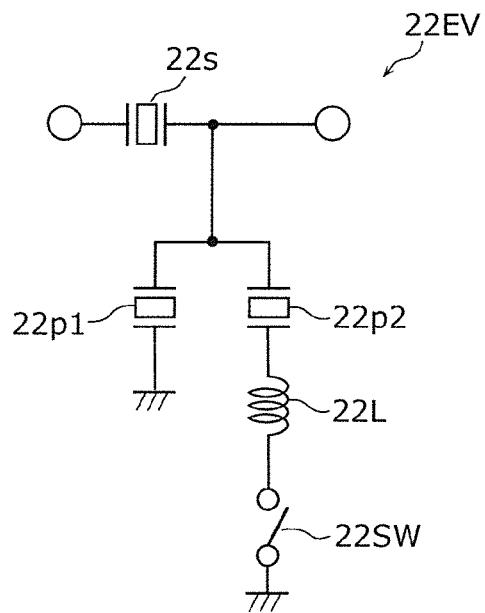
FIG. 13B is a circuit block diagram of a frequency variable filter according to Modification 3 of Embodiment 2.

FIG. 13A is a circuit block diagram of a filter element 22DV according to Modification 2 of Embodiment 2. FIG. 13B is a circuit block diagram of a filter element 22EV according to Modification 3 of Embodiment 2. As illustrated in FIGS. 13A and 13B, the filter elements 22DV and 22EV according to Modifications 2 and 3 are different in circuit configuration from the filter element 22AV according to Embodiment 2 in that an inductor is additionally inserted in series between the parallel arm resonator and the ground terminal. In the following, description of the same points as those in the filter element 22AV according to Embodiment 2 is omitted, and different points are primarily described.

As illustrated in FIG. 13A, the filter element 22DV according to Modification 2 of Embodiment 2 includes the serial arm resonator 22s, the parallel arm resonators 22p1 and 22p2, the switch 22SW, an inductor 22L, the input terminal 22m (first input/output terminal), and the output terminal 22n (second input/output terminal). In Modification 2, the inductor 22L is connected to the parallel arm resonator 22p1 and the ground terminal.

As illustrated in FIG. 13B, the filter element 22EV according to Modification 3 of Embodiment 2 includes the serial arm resonator 22s, the parallel arm resonators 22p1 and 22p2, the switch 22SW, an inductor 22L, the input terminal 22m, and the output terminal 22n. In Modification 3, the inductor 22L is connected to the parallel arm resonator 22p2 and the switch 22SW. Alternatively, in Modification 3, the inductor 22L may be connected to the switch 22SW and the ground terminal.

With the configuration of Modification 2, since the inductor 22L is connected to the parallel arm resonator 22p1 in series, the band width can be widened. With the configuration of Modification 3, since the inductor 22L is inserted in series, a resonant frequency specified by a combination of the inductor 22L and the parallel arm resonator 22p2 is reduced. In expectation of such a frequency reduction, therefore, the resonant frequency of the parallel arm resonator 22p2 can be designed to have a higher value. Thus, the size of the parallel arm resonator 22p2 added to the ladder filter circuit can be reduced, and space saving can be realized.

In the filter elements 22AV, 22DV and 22EV according to this embodiment, a plurality of resonator circuits each constituted by the parallel arm resonator 22p2 and the switch 22SW connected in series may be connected in parallel between the node x2 and the ground terminal. Resonant frequencies of the parallel arm resonators in the plurality of parallel resonance circuits may be different from one another. In such a case, by optionally selecting the switches 22SW to be electrically conducted, the band width can be more finely adjusted in the band pass characteristics that are specified by the serial arm resonator 22s and the parallel arm resonator 22p1.

The resonant frequencies of the parallel arm resonators in the resonator circuits may be all the same. In such a case, by turning on or off all the switches 22SW at a time, the band width in the switched-on state can be narrowed in comparison with that in the cases of using the filter elements 22AV, 22DV and 22EV according to Embodiment 2.

[2.7 Configuration of Frequency Variable Filter According to Modification 4]

In the above-described configuration of Embodiment 2, the parallel arm resonator and the switch 22SW for making the bandpass characteristics tunable are added to the one serial arm resonator 22s and the one parallel arm resonator 22p1. On the other hand, Modification 4 is described in connection with a frequency variable filter including plural stages of filter structures, each stage being a combination of one serial arm resonator and one parallel arm resonator.

Figure 14A:
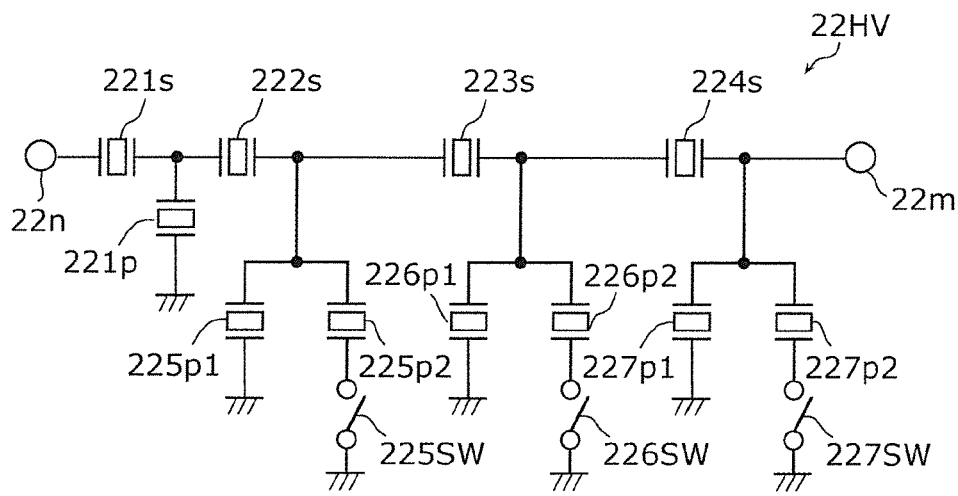
FIG. 14A is a circuit block diagram of a frequency variable filter according to Modification 4 of Embodiment 2.

FIG. 14A is a circuit block diagram of a filter element 22HV according to Modification 4 of Embodiment 2. In the following, description of the same points as those in the filter element 22AV according to Embodiment 2 is omitted, and different points are primarily described.

As illustrated in FIG. 14A, the filter element 22HV is a ladder frequency variable filter including serial arm resonators 221s, 222s, 223s and 224s, and parallel arm resonators (first parallel arm resonators) 221p, 225p1, 226p1 and 227p1. The serial arm resonator 221s and the parallel arm resonator 221p constitute one stage of filter structure, and the serial arm resonator 222s and the parallel arm resonator 225p1 constitute one stage of filter structure. The serial arm resonator 223s and the parallel arm resonator 226p1 constitute one stage of filter structure, and the serial arm resonator 224s and the parallel arm resonator 227p1 constitute one stage of filter structure. Thus, the filter element 22HV has four stages of filter structures.

The filter elements 22HV further includes parallel arm resonators (second parallel arm resonators) 225p2, 226p2 and 227p2, and switches (switch elements) 225SW, 226SW and 227SW for making bandpass characteristics tunable. A circuit constituted by the parallel arm resonator 225p2 and the switch 225SW connected in series is connected in parallel to the parallel arm resonator 225p1. A circuit constituted by the parallel arm resonator 226p2 and the switch 226SW connected in series is connected in parallel to the parallel arm resonator 226p1. A circuit constituted by the parallel arm resonator 227p2 and the switch 227SW connected in series is connected in parallel to the parallel arm resonator 227p1. Thus, each of the filter structures in three stages among the plural stages includes the second parallel arm resonator and the switch element.

Here, a resonant frequency of the parallel arm resonator 225p2 is higher than that of the parallel arm resonator 225p1, a resonant frequency of the parallel arm resonator 226p2 is higher than that of the parallel arm resonator 226p1, and a resonant frequency of the parallel arm resonator 227p2 is higher than that of the parallel arm resonator 227p1.

Furthermore, the resonant frequency of the parallel arm resonator 225p2 is lower than that of the parallel arm resonator 226p2, and the resonant frequency of the parallel arm resonator 226p2 is lower than that of the parallel arm resonator 227p2 (i.e., the resonant frequency of the parallel arm resonator 225p2<the resonant frequency of the parallel arm resonator 226p2<the resonant frequency of the parallel arm resonator 227p2). Although, in FIG. 14A, the parallel arm resonator having the lower resonant frequency is arranged closer to the output terminal 22n, the order in arrangement of the resonators is not limited to such an example.

Figure 14B:
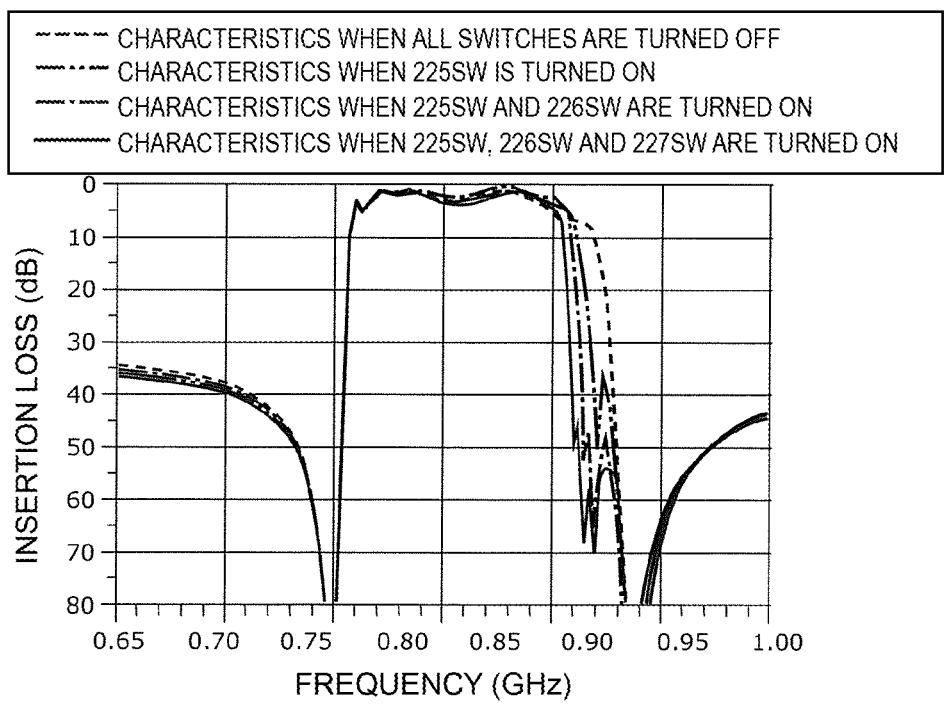
FIG. 14B is a graph representing bandpass characteristics of the frequency variable filter according to Modification 4 of Embodiment 2.
Figure 15:
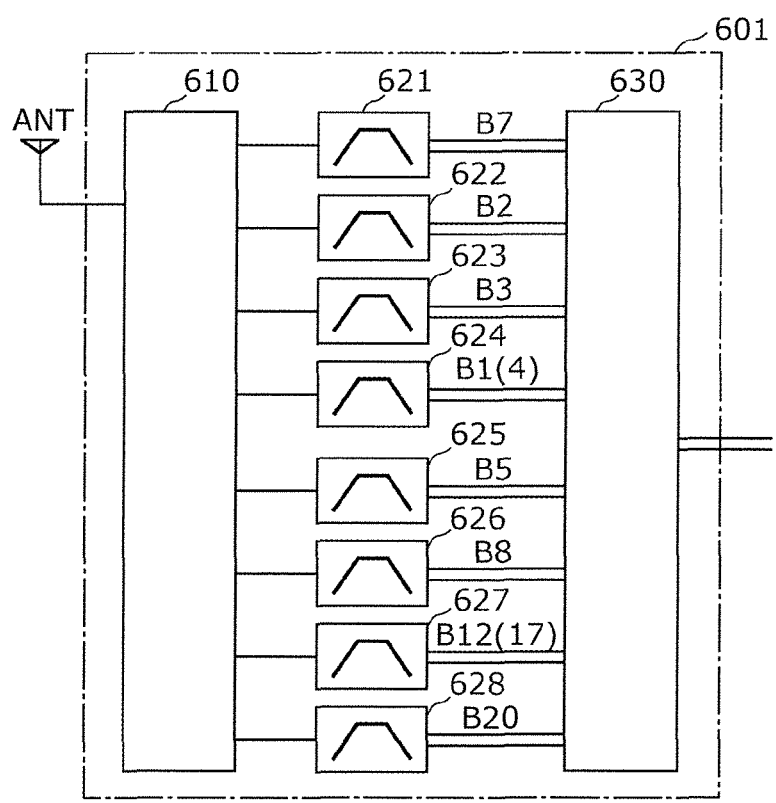
FIG. 15 is a circuit block diagram of a front-end module disclosed in Patent Document 1.

FIG. 14B is a graph representing the bandpass characteristics of the filter element 22HV according to Modification 4 of Embodiment 2. The graph of FIG. 14B represents the bandpass characteristics (denoted by a dashed line) when all the switches 225SW to 227SW are turned off, the bandpass characteristics (denoted by a two-dot-chain line) when only the switch 225SW is turned on, the bandpass characteristics (denoted by a one-dot-chain line) when the switches 225SW and 226SW are turned on, and the bandpass characteristics (denoted by a solid line) when all the switches 225SW to 227SW are turned on.

As seen from the graph, as the number of switches in the turned-on state among the switches 225SW to 227SW increases, an attenuation on the higher frequency side of a pass band of the filter element 22HV increases. Accordingly, as the number of turned-on switches among the switches 225SW to 227SW increases, a higher frequency end of the pass band of the filter element 22HV shifts toward the lower frequency side, and the band width is narrowed.

According to the configuration of this modification, the band width can be more finely adjusted with selection of the switch elements.

In Embodiment 2 and the modifications thereof, the number of stages in the filter element 22HV is not limited to four.

The resonant frequencies of the parallel arm resonator 225p2, the parallel arm resonator 226p2, and the parallel arm resonator 227p2 may be all the same. Even in such a case, the band width can be adjusted by turning on or off the switches 225SW to 227SW at a time, for example.

The frequency variable filter according to this embodiment may have a longitudinally-coupled filter structure. With addition of the longitudinally-coupled resonator, the filter can be further adapted for demanded filter characteristics such as band broadening and enhancement of attenuation.

The frequency variable filter according to this embodiment may be a duplexer including a transmission-side filter and a reception-side filter.

OTHER EMBODIMENTS, ETC.

While the radio frequency front-end circuits according to the embodiments of the present disclosure have been described in connection with Embodiments 1 and 2 and Modifications, the radio frequency front-end circuit of the present disclosure is not limited to the above-described embodiments and modifications. The present disclosure further includes other embodiments realized by combining optional constituent elements in the above-described embodiments and modifications, other modifications obtained by variously modifying the above-described embodiments on the basis of ideas conceivable by those skilled in the art within the scope of the gist of the present disclosure, and various devices each incorporating the radio frequency front-end circuit disclosed herein.

For example, a communication device including the RFIC 4 processing a baseband signal or a radio frequency signal, and the above-described radio frequency front-end circuit also falls within the scope of the present disclosure. Reduction in size and cost can be realized in such a communication device.

In the filter elements in the radio frequency front-end circuits according to the above-described Embodiments 1 and 2 and Modifications thereof, the piezoelectric substrate 50 constituting each surface acoustic wave filter may have a structure in which a high acoustic-velocity support substrate, a low acoustic-velocity film, and a piezoelectric film are laminated in the mentioned order. The piezoelectric film is made of, for example, a 50° Y cut X SAW propagation $LiTaO_3$ piezoelectric single crystal or piezoelectric ceramic (i.e., a lithium tantalate single crystal obtained by cutting the single crystal along a plane having a normal line that is given by an axis rotated through 50° from a Y axis with an X axis being a center axis or ceramic, the single crystal or the ceramic allowing a surface acoustic wave to propagate in the X-axis direction). A thickness of the piezoelectric film is 600 nm, for example. The high acoustic-velocity support substrate is a substrate for supporting the low acoustic-velocity film, the piezoelectric film, and the IDT electrode 54. More specifically, the high acoustic-velocity support substrate is a substrate having properties that a bulk wave inside the high acoustic-velocity support substrate has a higher acoustic velocity than acoustic waves, i.e., a surface wave and a boundary wave, propagating in the piezoelectric film. Thus, the high acoustic-velocity support substrate has the function of enclosing the surface acoustic wave in a portion in which the piezoelectric film and the low acoustic-velocity film are laminated, and of preventing the surface acoustic wave from leaking to the lower side than the high acoustic-velocity support substrate. The high acoustic-velocity support substrate is a silicon substrate, for example, and its thickness is 200 μm, for example. The low acoustic-velocity film is a film having properties that a bulk wave inside the low acoustic-velocity film has a lower acoustic velocity than a bulk wave propagating in the piezoelectric film. The low acoustic-velocity film is arranged between the piezoelectric film and the high acoustic-velocity support substrate. Energy of the surface acoustic wave is suppressed from leaking to the outside of the IDT electrode due to not only the above-described structure, but also such intrinsic properties of an acoustic wave that the acoustic wave energy tends to concentrate in a medium having a relatively low acoustic velocity. The low acoustic-velocity film is a film containing, for example, silicon dioxide as a main ingredient. A thickness of the low acoustic-velocity film is 670 nm, for example. With the above-described multilayer structure, Q-values at the resonant frequency and the anti-resonant frequency can be increased to a larger extent than those obtained with a structure in which the piezoelectric substrate 50 is made of a single layer. Thus, since a surface acoustic wave resonator having a higher Q-value can be constituted, a filter with a smaller insertion loss can be constituted using such a surface acoustic wave resonator.

The high acoustic-velocity support substrate may have a structure in which a support substrate and a high acoustic-velocity film are laminated, the high acoustic-velocity film having properties that a bulk wave propagating therein has a higher acoustic velocity than acoustic waves, i.e., a surface wave and a boundary wave, propagating in the piezoelectric film. In that case, the support substrate may be given by a substrate made of sapphire, a piezoelectric body such as lithium tantalate, lithium niobate, or quartz, one of various ceramics including alumina, magnesia, silicon nitride, aluminum nitride, silicon carbide, zirconia, cordierite, mullite, steatite, and forsterite, a dielectric such as glass, a semiconductor such as silicon or gallium nitride, or a resin. The high acoustic-velocity film may be one of various high acoustic-velocity materials such as aluminum nitride, aluminum oxide, silicon carbide, silicon nitride, silicon oxynitride, a DLC film, and diamond, a medium containing one among those materials as a main ingredient, and a medium containing a mixture of two or more among those materials as a main ingredient.

INDUSTRIAL APPLICABILITY

The present disclosure can be widely applied to various communication units, such as a cellular phone, because the present disclosure is implemented as a small-sized and low-cost radio frequency front-end circuit and communication device, which are compatible for multiband and multimode systems selectively using three or more bands.

REFERENCE SIGNS LIST 1 antenna element
2, 2A, 2B, 2C, 2D, 2E RF front-end circuit
3, 5 power amplifier circuit
4 RF signal processing circuit (RFIC)
6, 6A communication device
11a, 11b, 54 IDT electrode
20 antenna common terminal
21, 23, 23a, 23b, 523, 524 switch circuit
21c, 23ac, 23bc, 23c common terminal
21s1, 21s2, 23as1, 23as2, 23bs1, 23bs2, 23s1, 23s2, 23s3, 23s4 select terminal
22A, 22AV, 22B, 22C, 22CV, 22CH, 22D, 22DL, 22DV, 22EV, 22HV, 522AV filter element
22A1, 22A2 bandpass characteristics
22m input terminal
22n output terminal
22p1, 22p2, 221p, 225p1, 225p2, 226p1, 226p2, 227p1, 227p2 parallel arm resonator
22s, 221s, 222s, 223s, 224s serial arm resonator
22SW, 225SW, 226SW, 227SW, 610, 630 switch
24A, 24B, 24C, 24D duplexer
50 piezoelectric substrate
55 protective layer
110a, 110b electrode finger
111a, 111b busbar electrode
522A1, 522A2 transmission-side filter
541 close contact layer
542 main electrode layer
601 front-end module
621, 622, 623, 624, 625, 626, 627, 628 SAW filter

The invention claimed is:

1. A radio frequency front-end circuit comprising:
an antenna common terminal connected to an antenna;
a first switch circuit being a single pole double throw switch and comprising a common terminal connected to the antenna terminal and two select terminals;
a first filter circuit having a first end connected to a first of the two select terminals of the first switch circuit;
a second filter circuit having a first end connected to a second of the two select terminals of the first switch circuit; and
a third filter circuit having a first end connected to the antenna terminal, wherein:
the first, second, and third filter circuits are configured to allow radio frequency signals in different frequency bands to pass therethrough,
a pass band of the first filter circuit does not overlap with a pass band of the third filter circuit,
a pass band of the second filter circuit does not overlap with the pass band of the third filter circuit, and
the pass band of the first filter circuit and the pass band of the second filter circuit at least partly overlap with each other, or a frequency interval between the pass band of the first filter circuit and the pass band of the second filter circuit is not more than 3% of a center frequency between the pass band of the first filter circuit and the pass band of the second filter circuit.

2. The radio frequency front-end circuit according to claim 1, wherein the first, second, or third filter circuit is a frequency variable filter of which the pass band is variable.

3. The radio frequency front-end circuit according to claim 2, wherein the frequency variable filter comprises:
a first input/output terminal and a second input/output terminal, wherein a signal path connects the first input/output terminal and the second input/output terminal;
a serial arm resonator connected in the signal path between the first input/output terminal and the second input/output terminal;
a first parallel arm resonator connected between a ground terminal and a node on the signal path;
a second parallel arm resonator connected between the node and the ground terminal; and
a switch disposed between the node and the ground terminal, and configured to selectively establish an electrical path interconnecting the node, the second parallel arm resonator, and the ground terminal,
wherein a resonant frequency of the first parallel arm resonator is lower than a resonant frequency of the serial arm resonator, and
a resonant frequency of the second parallel arm resonator is higher than the resonant frequency of the first parallel arm resonator.

4. The radio frequency front-end circuit according to claim 3, wherein the resonant frequency of the second parallel arm resonator is higher than the resonant frequency of the serial arm resonator and lower than an anti-resonant frequency of the serial arm resonator.

5. The radio frequency front-end circuit according to claim 3, wherein the frequency variable filter further comprises a plurality of resonance circuits, each of the plurality of resonance circuits comprising a parallel arm resonator and a switch connected in series, and each of the plurality of resonance circuits being connected in parallel with each other between the node and the ground terminal, wherein resonant frequencies of the parallel arm resonators in each of the plurality of resonance circuits are different from each another.

6. The radio frequency front-end circuit according to claim 3, wherein the frequency variable filter comprises a plurality of filter stages, each filter stage comprising a serial arm resonator and a parallel arm resonator, and wherein at least two of the plurality of filter stages comprise a parallel arm resonator and a switch connected in series.

7. The radio frequency front-end circuit according to claim 3, further comprising a first inductor connected in series between the second parallel arm resonator and the switch.

8. The radio frequency front-end circuit according to claim 1, further comprising:

a first impedance matching circuit connected to the first select terminal of the first switch circuit, and a second impedance matching circuit connected to the second select terminal of the first switch circuit, wherein a complex impedance of the first impedance matching circuit and a complex impedance of the second impedance matching circuit are different from each other.

9. The radio frequency front-end circuit according to claim 8, wherein the first impedance matching circuit comprises a second inductor connected between the first select terminal of the first switch circuit and a ground terminal, the second impedance matching circuit comprises a third inductor connected between the second select terminal of the first switch circuit and the ground terminal, and an inductance value of the second inductor and an inductance value of the third inductor are different from each other.

10. The radio frequency front-end circuit according to claim 1, further comprising a second switch circuit comprising a common terminal, a first select terminal connected to a second end of the first filter circuit, a second select terminal connected to a second end of the second filter circuit, and a third select terminal connected to a second end of the third filter circuit.

11. The radio frequency front-end circuit according to claim 1, wherein the first, second, and third filter circuits are each a surface acoustic wave filter, an acoustic wave filter using BAW, an LC resonance filter, or a dielectric filter.

12. The radio frequency front-end circuit according to claim 1, wherein the first switch circuit comprises a FET switch made of GaAs or CMOS, or a diode switch.

13. The radio frequency front-end circuit according to claim 1, further comprising an amplifier configured to amplify a transmit radio frequency signal or a received radio frequency signal, wherein each of the first, second, and third filter circuits is configured to pass or block the transmit radio frequency signal amplified by the amplifier or the received radio frequency signal based on a frequency of the transmit radio frequency signal or a frequency the received radio frequency signal.

14. The radio frequency front-end circuit according to claim 1, further comprising fourth filter circuit having a first end connected to the antenna terminal.

15. The radio frequency front-end circuit according to claim 14, further comprising a second switch circuit comprising a common terminal, a first select terminal connected to a second end of the first filter circuit, a second select terminal connected to a second end of the second filter circuit, a third select terminal connected to a second end of the third filter circuit, and a fourth select terminal connected to a second end of the fourth filter circuit.

16. A communication device comprising:

an RF signal processing circuit that processes a baseband signal or a radio frequency signal; and the radio frequency front-end circuit according to claim 1.

* * * * *

UNITED STATES PATENT AND TRADEMARK OFFICE
CERTIFICATE OF CORRECTION

PATENT NO. : 10,382,009 B2
APPLICATION NO. : 16/056935
DATED : August 13, 2019
INVENTOR(S) : Koji Nosaka Page 1 of 1

It is certified that error appears in the above-identified patent and that said Letters Patent is hereby corrected as shown below:

In the Specification

Column 13, Line 45, "that a SPOT" should read -- that a SP4T --

Column 14, Line 20, "the SPOT" should read -- the SP4T --

Signed and Sealed this
Thirteenth Day of October, 2020

Andrei Iancu
*Director of the United States Patent and Trademark Office*